United States Patent

Dhuler et al.

[11] Patent Number: 6,023,121
[45] Date of Patent: *Feb. 8, 2000

[54] THERMAL ARCHED BEAM MICROELECTROMECHANICAL STRUCTURE

[75] Inventors: Vijayakumar R. Dhuler, Raleigh; Robert L. Wood, Cary; Ramaswamy Mahadevan, Chapel Hill, all of N.C.

[73] Assignee: MCNC, Research Triangle Park, N.C.

[*] Notice: This patent is subject to a terminal disclaimer.

[21] Appl. No.: 09/232,940

[22] Filed: Jan. 19, 1999

Related U.S. Application Data

[60] Division of application No. 08/936,598, Sep. 24, 1997, and a continuation-in-part of application No. 08/767,192, Dec. 16, 1996.

[51] Int. Cl.[7] .................................................. H02N 10/00
[52] U.S. Cl. ............................................ 310/307; 310/306
[58] Field of Search ...................................... 310/306, 307

[56] References Cited

U.S. PATENT DOCUMENTS

| | | | |
|---|---|---|---|
| 1,258,368 | 3/1918 | Smith | 60/529 |
| 1,658,669 | 2/1928 | Cohn et al. | 310/306 |
| 3,213,318 | 10/1965 | Glenn | 310/306 |
| 3,609,593 | 9/1971 | Bell et al. | 310/330 |
| 4,806,815 | 2/1989 | Honna | 310/307 |
| 5,179,499 | 1/1993 | MacDonald et al. | 361/313 |
| 5,184,269 | 2/1993 | Shimada et al. | 361/24 |

(List continued on next page.)

FOREIGN PATENT DOCUMENTS

| | | | |
|---|---|---|---|
| 0 469 749 | 2/1992 | European Pat. Off. | F16K 7/14 |
| 0 478 956 | 4/1992 | European Pat. Off. | H01H 1/00 |
| 0 665 590 | 8/1995 | European Pat. Off. | H01L 23/00 |
| 764821 | of 0000 | France . | |
| 38 09 597 | 10/1989 | Germany | G05D 3/00 |
| 792145 | of 0000 | United Kingdom . | |
| WO 89/09477 | 10/1989 | WIPO | H01H 1/00 |

OTHER PUBLICATIONS

J.W. Judy, T. Tamagawa and D.L. Polia, Surface Micromachined Linear Thermal Microactuator, *International Electron Devices Meeting 1990. Technical Digest (CAT. No. 90CH2865–4,* Dec. 1990, pp. 629–632, New York, New York.

Gary K. Fedder and Roger T. Howe, Multimode Digital Control of a Suspended Polysilicon Microstructure, *Journal of Microelectromechanical Systems,* Dec. 1996, pp. 238–297, vol. 5, No. 4.

John H. Comtois and Victor M. Bright, Applications for surface–micromachined polysilicon thermal actuators and arrays, *Sensors and Actuators,* Jan. 1997, pp. 19–25, vol. 58, No. 1.

Liwei Lin and Shiao–Hong Lin, Vertically driven mcroactuators by electrothermal buckling effects, *Sensors and Actuators,* Nov. 1998, pp. 35–39, vol. 71, No. 1–2.

Klaassen E H et al: "Silicon Fusion Bonding and Deep Reactive Ion Etching: A New Technology for Microstructures" *Sensors and Actuators A,* vol. 52, No. 1/03, Mar. 1996, pp. 132–139.

(List continued on next page.)

*Primary Examiner*—Thomas M. Dougherty
*Attorney, Agent, or Firm*—Alston & Bird LLP

[57] ABSTRACT

A MEMS actuator is provided that produces significant forces and displacements while consuming a reasonable amount of power. The MEMS actuator includes a microelectronic substrate, spaced apart supports on the substrate and a metallic arched beam extending between the spaced apart supports. The MEMS actuator also includes a heater for heating the arched beam to cause further arching of the beam. In order to effectively transfer heat from the heater to the metallic arched beam, the metallic arched beam extends over and is spaced, albeit slightly, from the heater. As such, the MEMS actuator effectively converts the heat generated by the heater into mechanical motion of the metallic arched beam. A family of other MEMS devices, such as relays, switching arrays and valves, are also provided that include one or more MEMS actuators in order to take advantage of its efficient operating characteristics. In addition, a method of fabricating a MEMS actuator is further provided.

7 Claims, 15 Drawing Sheets

U.S. PATENT DOCUMENTS

| | | |
|---|---|---|
| 5,261,747 | 11/1993 | Deacutis et al. .......................... 374/137 |
| 5,309,056 | 5/1994 | Culp ........................................ 310/306 |
| 5,355,712 | 10/1994 | Peterson et al. ......................... 73/1.38 |
| 5,367,584 | 11/1994 | Ghezzo et al. ............................ 385/17 |
| 5,441,343 | 8/1995 | Pylkki et al. ............................ 374/137 |
| 5,467,068 | 11/1995 | Field et al. .................................. 335/4 |
| 5,475,318 | 12/1995 | Marcus et al. ........................... 324/762 |
| 5,483,799 | 1/1996 | Dalto ......................................... 62/3.7 |
| 5,536,988 | 7/1996 | Zhang et al. ............................. 310/309 |
| 5,558,304 | 9/1996 | Adams ................................. 244/134 A |
| 5,600,174 | 2/1997 | Reay et al. ............................... 257/401 |
| 5,629,665 | 5/1997 | Kaufmann et al. .................. 250/338.1 |
| 5,644,177 | 7/1997 | Guckel et al. ..................... 310/40 MM |
| 5,659,285 | 8/1997 | Takeda ..................................... 337/333 |
| 5,722,989 | 3/1998 | Fitch et al. .............................. 606/205 |
| 5,796,152 | 8/1998 | Carr et al. ................................ 257/415 |
| 5,813,441 | 9/1998 | Dewispelaere .......................... 139/455 |
| 5,862,003 | 1/1999 | Saif et al. ................................ 359/871 |

OTHER PUBLICATIONS

Phipps, Thesis: Design and Development Of Microswitches For Micro–Electro–Mechanical Relay Matrices, Air Force Inst. of Tech., Wright–Patterson AFB, OH School of Engineering, Jan. 1989.

Yamagata, et al., A Micro Mobile Mechanism Using Thermal Expansion And Its Theoretical Analysis—A Comparison With Impact Drive Mechanism Using Piezoelectric Elements, *Proceedings of the IEEE Micro Electro Mechanical Systems,* pp. 142–147, Jan. 1994.

Oh, et al., Thin Film Heater On A Thermally Isolated Microstructure, *Smart Materials Fabrication and Materials for Micro–Electro–Mechanical Systems,* pp. 277–282, Jan. 1992.

Safranek, The Properties Of Electrodeposited Metals & Alloys,*Amer. Electroplaters & Surface Finishers Society,* pp. 295–315, Jan. 1986.

Klassen, et al., Silicon Fusion Bonding And Deep Reactive Ion Etching; A New Technology For Microstructures, *Transducers '95—Eurosensors IX,* The 8th International Conference On Solid State Sensors And Actuators, and Eurosensors IX, Stockholm, Sweden, Jun. 25–29, 1995, pp. 556–559.

Noworolski, et al., Fabrication Of SOI Wafers With Buried Cavities Using Silicon Fusion Bonding And Electrochemical Etchback, *Transducers '95—Eurosensors IX,* The 8th International Conference On Solid State Sensors And Actuators, and Eurosensors IX, Stockholm, Sweden, Jun. 25–29, 1995, pp. 71–74.

Single Crystal Silicon Actuators And Sensors Based On Silicon Fusion Bonding Technology, Semi–Annual Progress Report 1, Advanced Research Projects Agency, Lucas NovaSenosr, Contract No. DAL 01–94–C–3411, Jul. 1994.

Single Crystal Silicon Actuators And Sensors Based On Silicon Fusion Bonding Technology, *Semi–Annual Progress Report 2, Advanced Research Projects Agency, Lucas NovaSensor,* Contract No. DAL 01–94–C–3411, Jan. 1995.

Single Crystal Silicon Actuators And Sensors Based On Silicon Fusion Bonding Technology, *Semi–Annual Progress Report, Advanced Research Projects Agency, Lucas NovaSensor,* Contract No. DAL 01–94–C–3411, Jul. 1995.

Single Crystal Silicon Actuators And Sensors Based On Silicon Fusion Bonding Technology, *Semi–Annual Progress Report, Advanced Research Projects Agency, Lucas NovaSensor,* Contract No. DAL 01–94–C–3411, Aug. 1996.

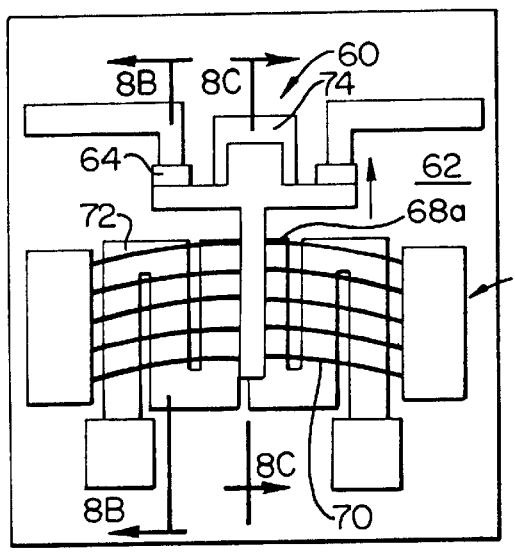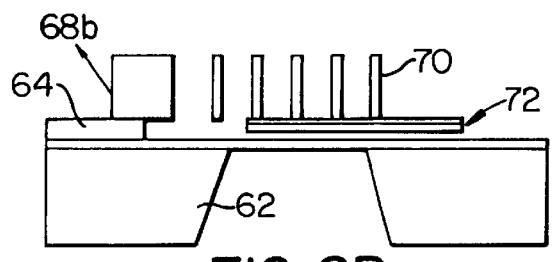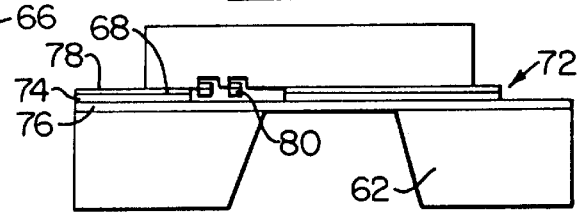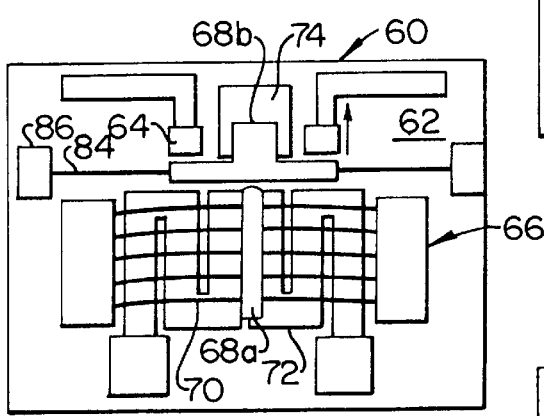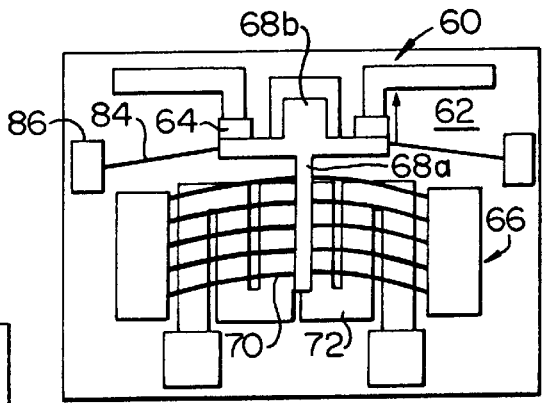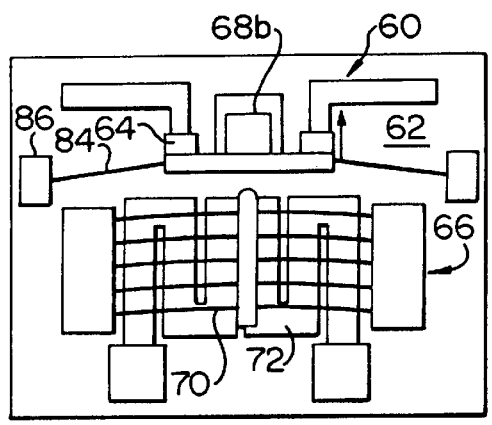

THERMAL ARCHED BEAM MICROELECTROMECHANICAL STRUCTURE

RELATED APPLICATION

This patent application is a divisional of U.S. patent application Ser. No. 08/936,598 filed Sep. 24, 1997 and a continuation-in-part of U.S. patent application Ser. No. 08/767,192 which was filed on Dec. 16, 1996, the contents of which are expressly incorporated in their entirety herein.

FIELD OF THE INVENTION

The present invention relates generally to microelectromechanical devices and, more particularly, to microelectromechanical devices that include thermal arched beam actuators and related fabrication methods.

BACKGROUND OF THE INVENTION

Microelectromechanical systems (MEMS) have recently been developed as alternatives for conventional electromechanical devices such as relays, actuators, valves and sensors. MEMS devices are potentially low cost devices, due to the use of microelectronic fabrication techniques. New functionality may also be provided because MEMS devices can be much smaller than conventional electromechanical devices.

Many potential applications of MEMS technology utilize MEMS actuators. For example, many sensors, valves and positioners use actuators for movement. If properly designed, MEMS actuators can produce useful forces and displacement, while consuming reasonable amounts of power. Many configurations of MEMS actuators have been proposed. For example, U.S. Pat. No. 5,475,318 to Marcus et al. entitled "Microprobe", discloses cantilever bimorph microprobes and doubly supported beam bimorph microprobes. In addition, an article entitled "*Silicon Fusion Bonding and Deep Reactive Ion Etching; A New Technology For Microstructures*", by Erno H. Klaassen, et al. presented at the International Conference on Solid-Date Sensors and Actuators, Transducers '95 held in Stockholm, Sweden in June 1995 describes a thermal actuator having a pair of arched beams extending between a pair of supports. By current through the arched beams, the arched beams will expand so as to further arched. The thermal actuator of the Klaassen article can also a include a center post that connects the plurality of arched beams and serves to push against the workpiece. The Klaassen article also describes a capacitive accelerometer structure that utilizes the thermal actuators to vary the spacing between a number of interdigitated fingers.

Notwithstanding the MEMS actuators that have previously been proposed, a number of existing and contemplated MEMS systems, such as relays, actuators, valves and sensors, require more sophisticated actuators that provide useful forces and displacements while consuming reasonable amounts of power in an efficient manner. Since it is desirable that the resulting MEMS systems be fabricated with batch processing, it is also preferred that the microelectronic fabrication techniques for manufacturing the resulting MEMS systems be affordable, repeatable and reliable.

SUMMARY OF THE INVENTION

The MEMS devices of the present invention include a particularly advantageous MEMS actuator, as well as a family of other MEMS devices, such as relays, switching arrays and valves, that include one or more MEMS actuators. In addition, a method of fabricating a MEMS actuator is also provided according of the present invention.

According to the present invention, a MEMS structure, hereinafter referred to as a MEMS actuator, includes a microelectronic substrate, spaced apart supports on the substrate and a metallic arched beam extending between the spaced apart supports. The MEMS actuator also includes means for heating the arched beam to cause further arching of the beam. Preferably, the heating means includes a heater extending between first and second opposed ends which, in turn, are disposed upon the microelectronic substrate.

In order to effectively transfer heat from the heater to the metallic arched beam, the metallic arched beam extends over and is spaced, albeit slightly, from the heater such that the heat generated by the heater causes the metallic arched beam to further arch. As such, the MEMS actuator of this advantageous embodiment effectively converts the heat generated by the heater into mechanical motion of the metallic arched beam. As described herein, numerous MEMS devices can incorporate the MEMS actuator of the present invention in order to provide a controllable force and displacement without consuming significant amounts of power.

The heater preferably includes an at least partially conductive material having high resistivity, such as polysilicon, titanium or tungsten, surrounded by a dielectric material, such as silicon nitride or silicon dioxide. The dielectric material surrounding the at least partially conductive material cooperates with an air gap defined between the metallic arched beam and the heater to electrically isolate the metallic arched beam from the at least partially conductive material. In order to effectively transfer the thermal energy generated by the heater to the metallic arched beam, the air gap is preferably small, such as less than about 5 microns and, more preferably, between about 1 micron and 2 microns. Likewise, the dielectric material is also preferably relative thin and, in one advantageous embodiment, has a thickness of about 0.5 micron.

The MEMS actuator also preferably includes a lengthwise extending actuator member connected to the metallic arched beam and extending outwardly in a first direction. According to one advantageous embodiment, the heater underlies and is aligned with the actuator member in the first direction. As a result of this alignment, the heat generated by the heater of this embodiment is even more efficiently transmitted to the actuator member and, in turn, to the metallic arched beam so as to cause further arching of the arched beam.

A number of MEMS devices have also been developed according to the present invention that utilize one or more MEMS actuators for providing useful forces and displacements while consuming reasonable amounts of power. For example, a MEMS relay of the present invention includes a microelectronic substrate, a first pair of contacts on the substrate and a first MEMS actuator on the substrate for controllably establishing electrical contact between the pair of contacts. The actuator member of the MEMS actuator preferably includes a lengthwise extending portion coupled to the arched beam and an enlarged contact portion, responsive to movement of the lengthwise extending portion, for establishing contact with the first pair of contacts. According to one embodiment, the actuator member, including the lengthwise extending portion and the enlarged contact portion, is a unitary structures. According to another embodiment, however, the lengthwise extending portion and the enlarged contact portion of the actuator members are separate structures positioned such that the lengthwise extending portion will move into contact with the enlarged contact portion upon movement of the lengthwise extending portion in response to heating of the arched beams, thereby urging the enlarged contact portion into contact with the first pair of contacts.

Upon actuation of the MEMS relay of the present invention, the actuator member is moved between an open position in which the actuator member is spaced i from the first pair of contacts and a closed position in which the actuator member contacts the first pair of contacts and establishes an electrical connection therebetween. In order to further reduce the power requirements of the MEMS relay, the MEMS relay preferably includes means for holding the actuator member in position following heating of the arched beam and movement of the actuator member. The holding means can include means for applying an electrostatic force between the actuator member and the substrate, thereby holding at least a portion of the actuator member against the substrate.

The MEMS relay can also include at least one retaining member on the substrate and positioned so as to underlie the actuator member once the actuator member has moved in response to heating of the arched beam. According to this advantageous embodiment, the actuator member also includes a lower surface facing the substrate that defines at least one recess for cooperably receiving a respective retaining member as the actuator member is held in position, such as by an electrostatic force.

Alternatively, the MEMS relay can include latch means for latching the actuator member in position following heating of the arched beam and movement of the actuator member. By latching the actuator member in position, electrical contact will be maintained between the first pair of contacts without having to continue actuating the MEMS actuator, thereby further reducing power requirements of the MEMS relay. According to one advantageous embodiment, the latch means includes a projection extending outwardly from the actuator member and an associated latch member for cooperably engaging the outwardly extending projection upon actuation of the MEMS actuator. The MEMS relay of this embodiment can also include reset means, typically including a second MEMS actuator having an actuator member that includes the latch member, for disengaging the latch member from the outwardly extending projection, thereby permitting the MEMS relay to return to a rest position.

In order to provide improved overvoltage protection, the MEMS relay can also include first and second field intensification structures electrically connected to respective ones of the first pair of contacts. The first and second field intensification structures are disposed in a facing relationship to thereby define a discharge gap. Preferably, each field intensification structure includes at least one pointed protection extending toward the other field intensification structure to more precisely define the discharge gap.

According to one embodiment, the MEMS relay includes a second MEMS actuator on a portion of the substrate opposite the first MEMS actuator relative to the first pair of contacts. The second MEMS actuator is designed to controllably disengage the actuator member of the first MEMS actuator from the first pair of contacts in order to reopen the first pair of contacts. Upon heating the arched beam of the second MEMS actuator, the actuator member of the second MEMS actuator preferably moves so as to contact the actuator member of the first MEMS actuator, thereby disengaging the actuator member of the first MEMS actuator from the first pair of contacts.

The MEMS relay of another advantageous embodiment alternately connects first and second pairs contacts. The MEMS relay of this embodiment includes a substrate, first and second pairs contacts on the substrate and first and second MEMS actuators on the substrate. The MEMS actuators are positioned such that upon actuation of the first MEMS actuator, the actuator member of the first MEMS actuator cooperably engages the actuator member of the second MEMS actuator. Once engaged electrical contact is established between the first pair of contacts in the absence of further actuation of either MEMS actuator. In contrast, electrical contact is only established between the second pair of contacts upon actuation of the second MEMS actuator.

The end portion of the actuator member of the second MEMS actuator preferably includes a sleeve that opens through the end thereof. Correspondingly, the end portion of the actuator member of the first MEMS actuator preferably includes an engagement portion for insertion through the end of the sleeve upon actuation of the first MEMS actuator. As such, the actuator members of the first and second MEMS actuators will remain cooperably engaged following the actuation of the first MEMS actuator.

Building upon the MEMS relays described above, a MEMS switching array is also provided that includes a substrate and a plurality of first and second MEMS actuators positioned on the substrate such that the plurality of first MEMS actuators define respective row elements and the plurality of second MEMS actuator define respective column elements. According to this embodiment, each MEMS actuator also includes a plurality of contact members spaced along the respective actuator member and extending outwardly therefrom. Upon actuation of a pair of first and second MEMS actuators, the respective actuator members are moved so as to establish electrical contact between the respective contact members, thereby establishing a continuous electrical path between the pair of first and second MEMS actuators.

The MEMS switching array can also include latch means for latching the actuator members of the respective pair of first and second MEMS actuators in position following actuation thereof. As such, electrical contact will be maintained between the respective contact members without having to continue actuating the respective pair of first and second MEMS actuators, thereby further reducing power requirements of the MEMS switching array. According to one advantageous embodiment, the latch means includes a latch member extending outwardly from each respective actuator member and a plurality of anchor members. Each anchor member is associated with a respective MEMS actuator and is positioned upon the substrate so as to cooperably engage the latch member upon actuation of the respective MEMS actuator.

The MEMS switching array can also include reset means for unlatching the actuator members of the respective pair of first and second MEMS actuators such that respective contact members separate and no longer make electrical contact in the absence of further actuation of the respective pair of first and second MEMS actuators. Advantageously, the reset means includes first and second reset actuators for resetting the plurality of first MEMS actuators and the plurality of second MEMS actuators, respectively. In addition, each reset actuator preferably includes an actuator member having a plurality of reset members spaced therealong. The plurality of reset members engage respective actuator members of the first and second MEMS actuators upon actuation of the reset actuator, thereby disengaging the latch portions of the actuator members from the respective anchor members.

According to another aspect of the present invention, a MEMS valve is provided that includes a substrate defining an opening and a MEMS actuator on the substrate and having a valve plate operably coupled to the arched beam, either directly or indirectly via an actuator member, that is adapted to at least partially covering the opening in the substrate. As such, the portion of the opening covered by the valve plate can be precisely controlled by moving the valve plate relative to the substrate upon actuation of the MEMS actuator. In order to further reduce the power consumed by the MEMS valve of the present invention, the MEMS valve can also include means for holding the valve plate in position relative to the opening without requiring further actuation of the arched beam.

In order to increase the flow rate of the MEMS valve, the substrate preferably defines a plurality of openings and the MEMS actuator correspondingly includes a plurality of valve plates operably coupled to the arched beam and adapted to at least partially cover respective ones of the openings. In order to increase the size of the openings, thereby further increasing the flow rate of the MEMS valve, the valve plate is preferably designed as an elongate plate that pivots about a pivot point, typically defined by a bearing post extending outwardly from the substrate, as the arched beam is heated in order to controllably adjust the portion of the opening covered by the valve plate. According to this embodiment, the openings defined by the substrate are preferably spaced angularly about the bearing post. As such, the MEMS valve of this embodiment has the general appearance of a fan with the pivoting valve plates serving as the fan blades. The MEMS valve of this embodiment can be designed to be either normally open or normally closed.

The present invention also provides an advantageous method for fabricating a MEMS structure, such as a MEMS actuator, that includes a metallic arched beam that overlies and is spaced from a heater. According to this method, a sacrificial plating base is initially deposited upon a first surface of a microelectronic substrate. Thereafter, a photoresist layer is deposited on the sacrificial plating base and is patterned to open one or more windows to the sacrificial plating base. The windows preferably correspond to the pair of spaced apart supports and the arched beam extending between the spaced apart supports of the resulting MEMS actuator. Thereafter, a metal, such as nickel, is electroplated within the windows defined by the photoresist layer to form the pair of spaced apart supports and the arched beams extending between spaced apart supports. The photoresist layer is thereafter removed and portions of the sacrificial plating base are etched to thereby release the arched beams from the substrate.

As an alternative to removing all of the plating base that underlies the arched beam in order to release the arched beam, an oxide layer can be formed and patterned so as to underlie the arched beam, but not the spaced apart supports. As such, removal of this oxide layer will release the arched beam from the substrate.

Prior to the depositing the sacrificial plating base upon the substrate, a heater can be formed on the first surface of the substrate. In addition, a cavity can be etched into the portion of the substrate underlying the heater, typically following the removal of the photoresist layer and the etching of the sacrificial plating base and/or the oxide layer, such that medial portions of the heater are further thermally isolated from the substrate.

By fabricating a MEMS structure according to the method of the present invention, metallic arched beams having large aspect ratios can be electroplated over a heater with a relatively small, typically 5 microns or less, spacing or air gap between the heater and the overlying metallic arched beam. As a result, heat generated by the heater is effectively transferred to the metallic arched beam for translation into mechanical motion of the arched beam. In addition, concurrent with the fabrication of a MEMS actuator as described above, the method of the present invention can also advantageously cofabricate the other portions of the MEMS structures of the present invention, such as the MEMS relays, the MEMS switching arrays and the MEMS valves.

As described above, MEMS structures, including the MEMS actuators, of the present invention provide significant forces and displacements while consuming reasonable amounts of power. In particular, the design of the MEMS actuator of the present invention provides efficient thermal transfer of the heat generated by the heater to the overlying metallic arched beam so as to create further arching of the metallic arched beam. In order to capitalize upon the efficient operation of the MEMS actuator of the present invention, a number of MEMS devices, such as a variety of MEMS relays, MEMS switching arrays and MEMS valves, are also advantageously provided.

BRIEF DESCRIPTION OF THE DRAWINGS

FIG. 8A is a top view and FIGS. 8B and 8C are cross-sectional views of a MEMS relay in a closed position wherein the MEMS relay includes a MEMS actuator according to one embodiment of the present invention.

FIGS. 9A–9C are top views of a MEMS relay including a MEMS actuator according to another embodiment of the present invention that illustrates the sequential operations performed to close and open the MEMS relay.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
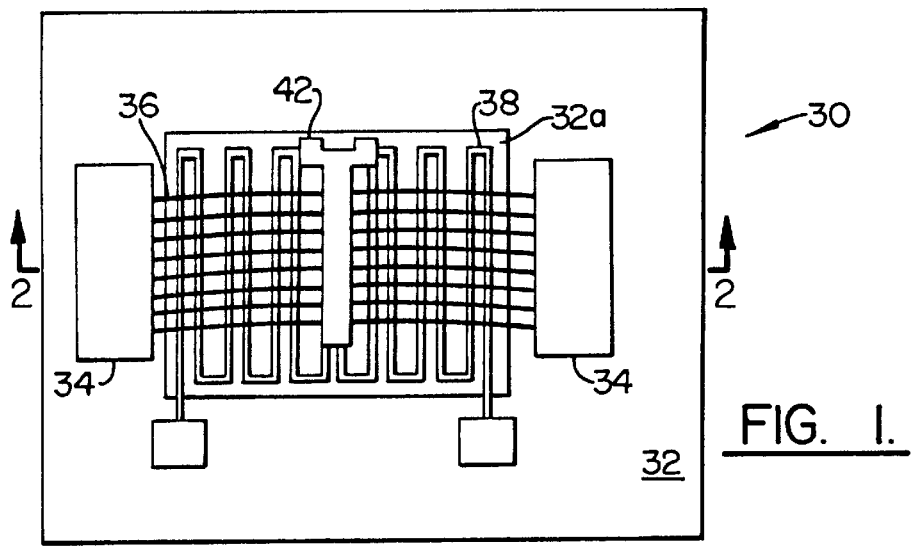
FIG. 1 is a top view of a MEMS actuator of one embodiment of the present invention that includes a heater for causing the beams to further arch.

Referring now to FIG. 1, a first embodiment of a MEMS structure according to the present invention as illustrated. Although the MEMS structure can be employed for a variety of purposes, including sensing and actuation, the MEMS structure will be hereinafter referred to as a MEMS actuator 30 for sake of clarity. The MEMS actuator includes a microelectronic substrate 32 and a pair of spaced apart supports 34 on the substrate. While the substrate can be formed of a variety of materials, the substrate is typically formed of silicon, glass or quartz.

The spaced apart supports 34 are preferably formed of metal, such as nickel, that is deposited on the substrate 32 by means of an electroplating process in order to have a high aspect ratio, as described hereinbelow. As known to those skilled in the art, electroplating techniques include, but are not limited to "LIGA" techniques.

The MEMS actuator 30 also includes at least one and, more preferably, a number of arched beams 36 extending between the spaced apart supports 34. Although the MEMS actuator can have any number and any size of arched beams, the MEMS actuator of one embodiment includes five arched beams which are 5 µm wide, 30 µm tall and 2 mm in length. The arched beams are also typically formed of a conductive material which has a positive coefficient of thermal expansion so that the arched beam expands as the arched beam is heated. In particular, the arched beams are preferably formed of a metal and, more preferably, are formed of nickel or a nickel-phosphorous alloy. As described above in conjunction with the spaced apart supports, the arched beams are also preferably formed by electroplating so as to have high aspect ratios. For example, the aspect ratio of the arched beams is preferably greater than 1.5:1 and more preferably is about 3:1. As shown in FIG. 1, the arched beams are arched in a direction which preferably extends parallel to the substrate 32. Although the arched beam is freed from the substrate, typically by means of a release layer and wet etching as described hereinbelow, the arched beam remains anchored at the spaced apart support and is arched toward the desired or predetermined direction of motion.

The MEMS actuator 30 also includes means for applying heat to the arched beams 36. The applied heat causes further arching of the beam as a result of the thermal expansion of the beam. The arching of the beam preferably occurs in the predetermined direction of motion so as to cause displacement of the arched beam. While a variety of techniques can be employed to heat the arched beam, the MEMS actuator of the illustrated embodiment includes an external heater 38. The external heater extends between first and second opposed ends that commonly serve as contact pads for establishing electrical contact with the heater. As shown in FIG. 1, the heater of one advantageous embodiment winds back and forth in a sinuous path beneath the metallic arched beams such that heat generated by the sinuous heater heats the metallic arched beams in a relatively even fashion.

Figure 2:
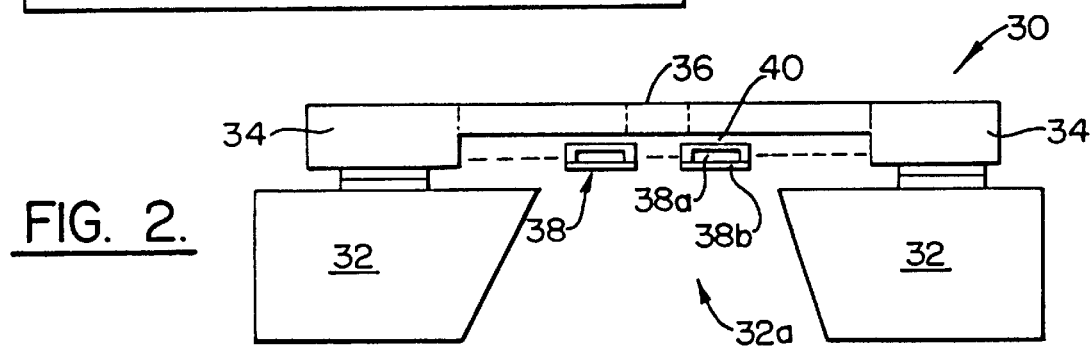
FIG. 2 is a cross-sectional view of the MEMS actuator of FIG. 1 taken along line 2—2 in which the dashed lines indicate the plurality of branches of the sinuous heater, two of which are illustrated for purposes of discussion.

Although the first and second ends of the heater 38 are disposed on the substrate 32, a portion of the substrate underlying the remainder of the heater, i.e., the medial portion of the heater, can be etched or otherwise removed in order to further thermally isolate the heater from the substrate, as described hereinbelow and as shown in FIG. 2. As shown in FIG. 1, the heater can extend in a cantilevered fashion over the cavity 32a defined within the substrate or, alternatively, the cavity defined by the substrate may be covered by a diaphragm, typically formed of a dielectric material such as silicon nitride, in order to structurally support the heater while maintaining sufficient thermal isolation between the heater and the substrate. Although not shown, a medial portion of the heater extending over the cavity defined in the substrate can be further supported by link, typically also formed of a dielectric material such as silicon nitride, that bridges between the heater and another portion of the substrate.

As described hereinbelow, the heater 38 generally includes a core 38a formed of an at least partially conductive material having a high resistivity, such as resistivity of at least 5×10⁻⁶ Ω·cm, and a coating 38b formed of a dielectric material surrounding the at least partially conductive material. In one embodiment, the heater includes a core of polysilicon, titanium or tungsten that is surrounding by a coating of silicon nitride or silicon dioxide. As shown in cross-section in FIG. 2, the arched beams 36 are electrically isolated from the at least partially conductive core of the heater by a combination of an air gap 40 and the dielectric coating of the heater. In order to transfer heat generated by the heater to the arched beam in the most efficient manner, the air gap is preferably reduced as much as possible while still maintaining sufficient electrical isolation, such as 1,000 volts in one exemplary embodiment. In one advantageous embodiment, the air gap is less than 5 microns and, more preferably, between 1 micron and 2 microns. For the embodiment in which the air gap is between 1 micron and 2 microns, the dielectric material covering the portion of the at least partially conductive material that faces the arched beam has a thickness of about 0.5 micron.

The MEMS actuator 30 of the present invention also preferably includes a lengthwise extending actuator member 42 coupled to the arched beams 36 and extending outwardly therefrom. The actuator member mechanically couples the plurality of arched beams at a point between the spaced apart supports 34 as shown in FIG. 1. As such, further arching of the arched beams in the predetermined direction displaces the actuator member in the same predetermined direction. By configuring multiple arched beams in an array, the resulting MEMS actuator enjoys force multiplication so that a large force and a large displacement may be provided. Moreover, by mechanically connecting multiple beams with the actuator member, the resulting MEMS actuator also enjoys a stiffening effect so as to be capable of providing even higher degrees of force than would be available by these same number of individual arched beams operating independently.

Although the MEMS actuator 30 of the present invention is preferably heated by means of an external heater 38 as described above and shown in FIGS. 1 and 2, the MEMS actuator can also be heated by passing current through the arched beams 36 or by combination of heating created by the external heater and by passing current through the arched beams. For example, external heating may provide the initial displacement of the MEMS actuator, while internal heating created by passing current through one or more of the arched beams may provide fine motion control. In addition, the MEMS actuator can be heated by external heating means, such as a hot plate, an oven, infra red light, radiation or the like. As such, the MEMS actuator of the present invention can be readily utilized as a temperature sensor or temperature switch.

Figure 3:
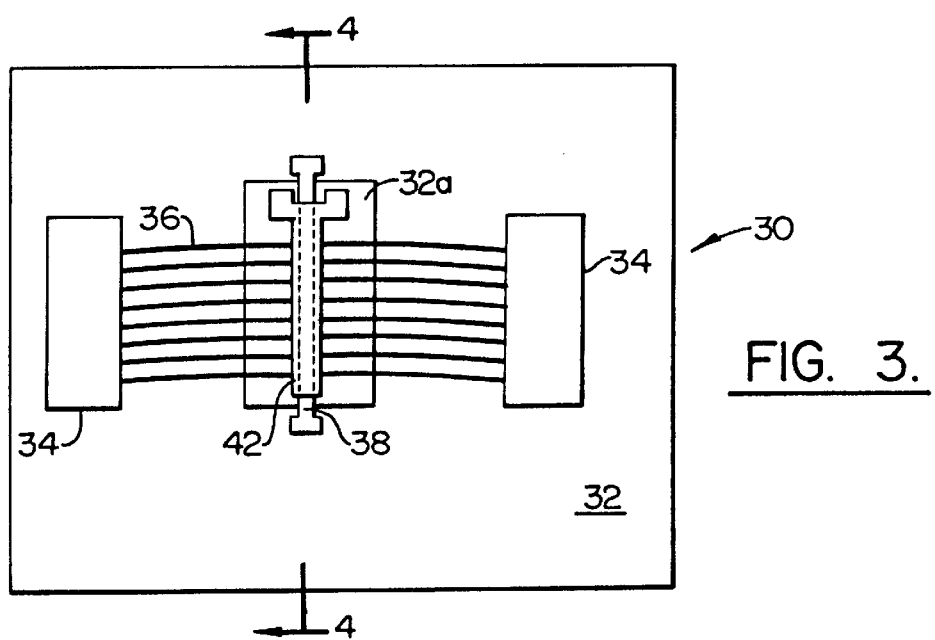
FIG. 3 is a MEMS actuator according to another embodiment of the present invention having a heater that underlies the actuator member.
Figure 4:
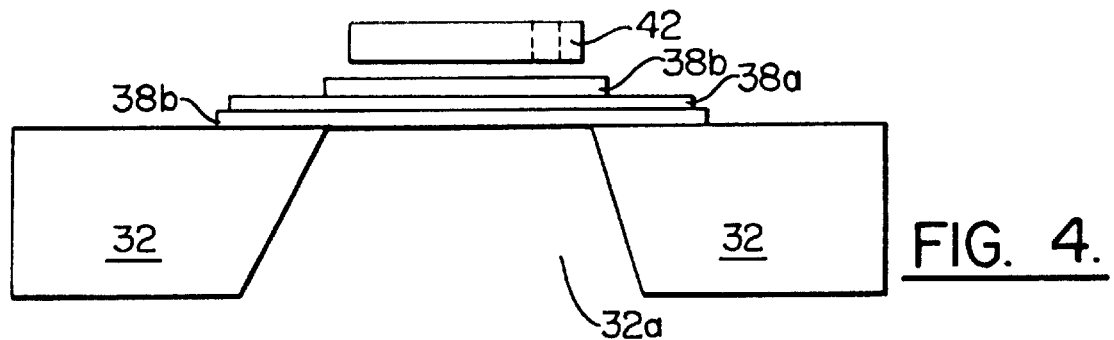
FIG. 4 is a cross-sectional view of the MEMS actuator of FIG. 3 taken along line 4—4.

As will be apparent to those skilled in the art, the heater 38 can take a variety of shapes, such as the sinuous heater shown in FIGS. 1 and 2. In one advantageous embodiment illustrated in FIGS. 3 and 4, however, the heater underlies and is aligned with the actuator member 42. As described above, the opposed ends of the heater are disposed on the substrate 32. However, the substrate underlying the medial portion of the heater between the first and second opposed ends is preferably etched or otherwise removed so as to further thermally isolate the heater from the substrate. See FIG. 4. In a like fashion to that described above, current can be passed through the heater to generate heat that is efficiently transferred to the arched beams 36 so as to cause further arching, thereby displacing the actuator member in the predetermined direction.

According to the present invention, a fabrication technique is also provided for forming MEMS structures, such as the MEMS actuator 30 having metallic arched beams 36 that is described above and illustrated in FIGS. 1–4. Although a wide variety of MEMS structures can be fabricated according to this advantageous method, the MEMS actuator depicted in FIGS. 1 and 2 in which a portion of the substrate underlying the heater 38 is etched or otherwise removed will be hereinafter described for purposes of illustration. Although cavity 32a defined by the substrate of the MEMS actuator of FIGS. 1 and 2 is open, the cavity could be covered with a diaphragm formed of an insulating material, such as silicon nitride, in order to further support the heater if so desired.

Figure 5A:
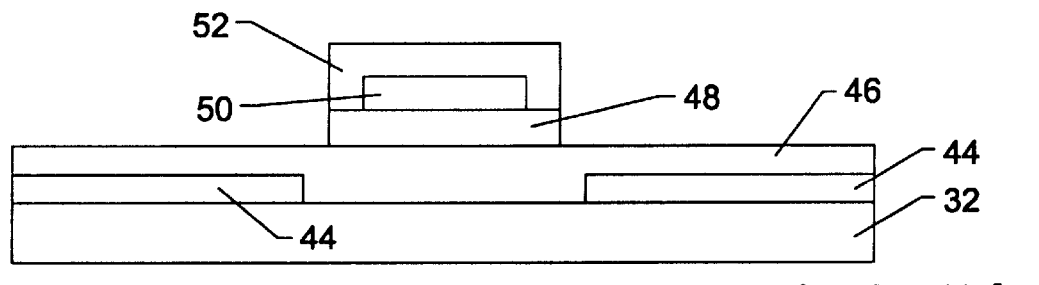
FIGS. 5A–5E are cross-sectional views illustrating the operations performed during the fabrication of a MEMS actuator of one embodiment of the present invention.

As shown in FIG. 5A, a maskant layer 44 of silicon nitride is initially deposited upon the substrate 32 and patterned to open a window corresponding to the cavity which will be eventually formed within the substrate. It will be understood by those having skill in the art that when a layer or element is described herein as being "on" another layer or element, it may be formed directly on the layer, at the top, bottom or side surface area, or one or more intervening layers may be provided between the layers.

After depositing an oxide layer 46, the heater 38 is then fabricated. In this regard, a silicon nitride layer 48 is deposited and patterned. Thereafter, a polysilicon layer 50 that will form the core 38a of the resulting heater is deposited upon the silicon nitride layer and a second silicon nitride layer 52 is deposited over the polysilicon layer, thereby encapsulating the polysilicon layer with silicon nitride as shown in FIG. 5A.

Figure 5B:
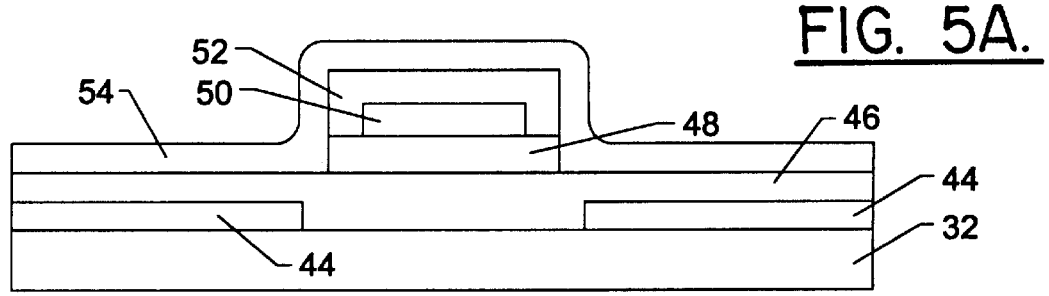
Figure 5C:
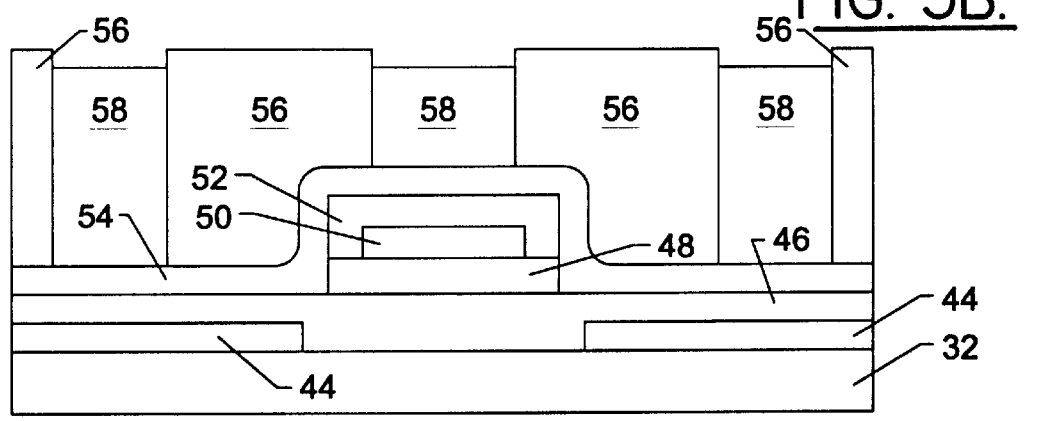

Once the heater 38 has been fabricated, a sacrificial plating base 54 is deposited as shown in FIG. 5B. The sacrificial plating base can be any of a variety of plating bases known to those skilled in the art, such as a three layer structure formed of titanium, copper and titanium. Following deposition of the plating base, a thick layer of photoresist 56 is deposited and lithographically patterned to open a number of windows to the sacrificial plating base. See FIG. 5C. The windows opened within the photoresist correspond to the various metallic components of the resulting MEMS structure, such as the spaced apart supports 34 and the plurality of arched beams 36 of a MEMS actuator 30. During the fabrication of devices, such as relays, switching arrays and valves, that include the MEMS actuator of the present invention, additional windows can be opened within the photoresist which correspond to other metal structures, such as contacts. The upper titanium layer that is exposed within the windows defined by the patterned photoresist is then etched. Thereafter, a metal 58, such as nickel, copper or gold, is electroplated within the windows defined by the photoresist to produce the intermediate structure shown in FIG. 5C. Although any of a variety of metals that are capable of being electroplated can be utilized, nickel is particularly advantageous since nickel has a relatively large thermal coefficient of expansion and since nickel can be deposited with low internal stress in order to further stiffen the resulting structure to out of plane deflection. Electroplating of nickel layers with low internal stress is described in "The Properties of Electrodeposited Metals and Alloys," H. W. Sapraner, American Electroplaters and Surface Technology Society, pp. 295–315 (1986), the contents of which is incorporated herein in its entirety.

Figure 5D:
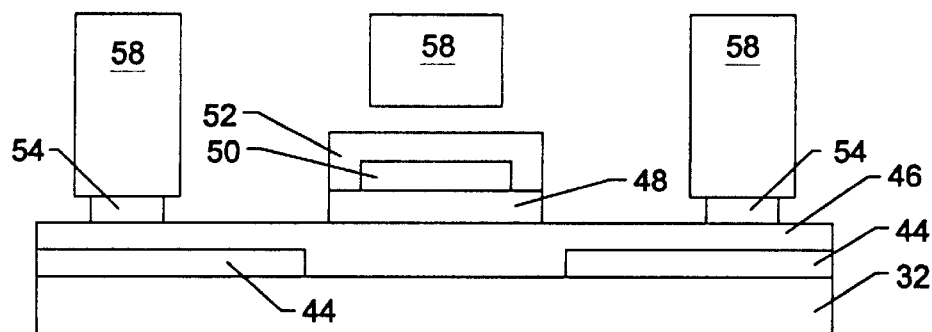
Figure 5E:
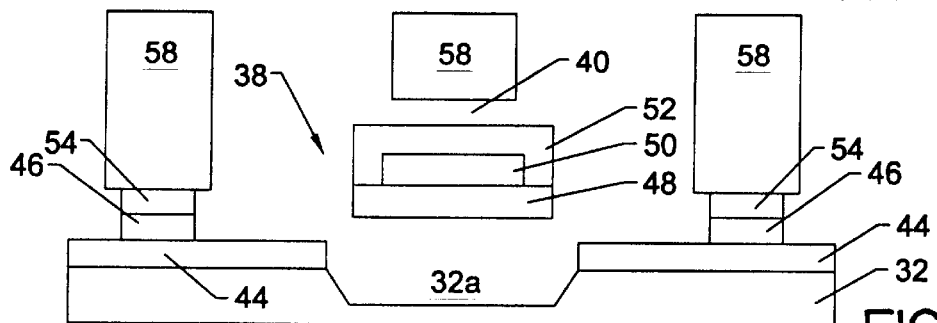

Once the metal 58 has been electroplated, the photoresist 56 is removed. As shown in FIG. 5D, the remaining layers of the plating base 54, namely, the copper and the lower titanium layer, are removed so as to release the arched beam 36 from the substrate 32. According to this embodiment, the duration of the etch of the plating base is preferably controlled so that the portion of the plating base underlying the arched beam is removed without removing a significant portion of the plating base that underlies the spaced apart supports 34 such that the arched beams, but not the spaced apart supports, are released from the substrate 32. In embodiments in which a cavity 32a is to be formed in the portion of the substrate underlying the heater 38, the oxide layer 46 is also etched to open a window to the substrate, i.e., the window defined by the maskant 44. By anisotropically etching the substrate, typically with KOH, a cavity can be formed beneath the heater in order to further thermally isolate the heater from the substrate. See FIG. 5E.

Figure 6A:
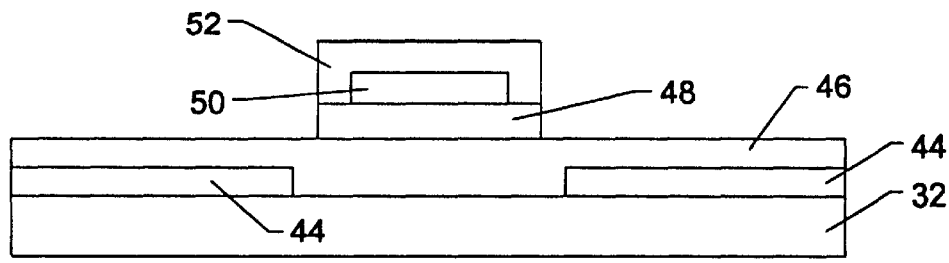
FIGS. 6A–6F are cross-sectional views illustrating the operations performed during the fabrication of a MEMS actuator of another embodiment of the present invention.
Figure 6B:
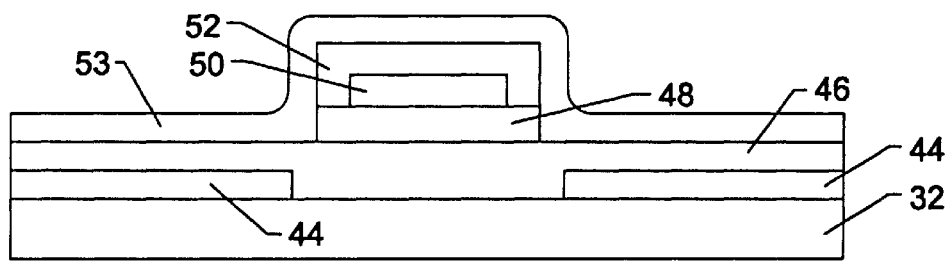
Figure 6C:
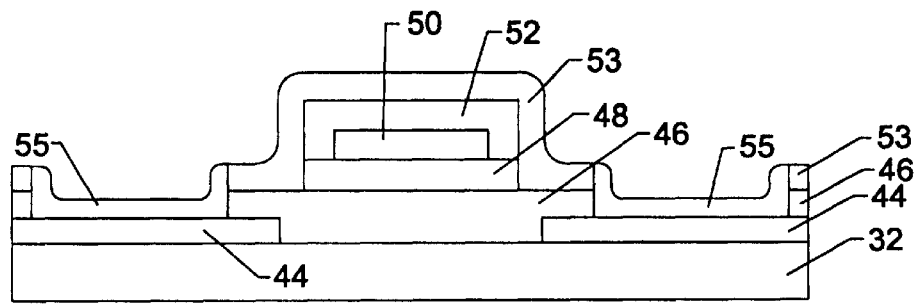
Figure 6D:
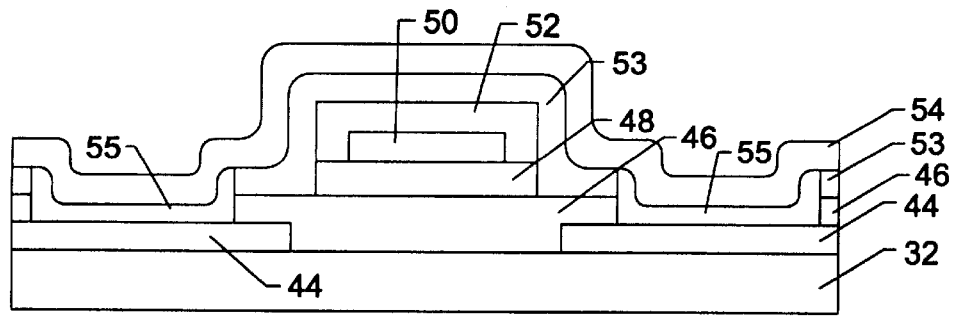
Figure 6E:
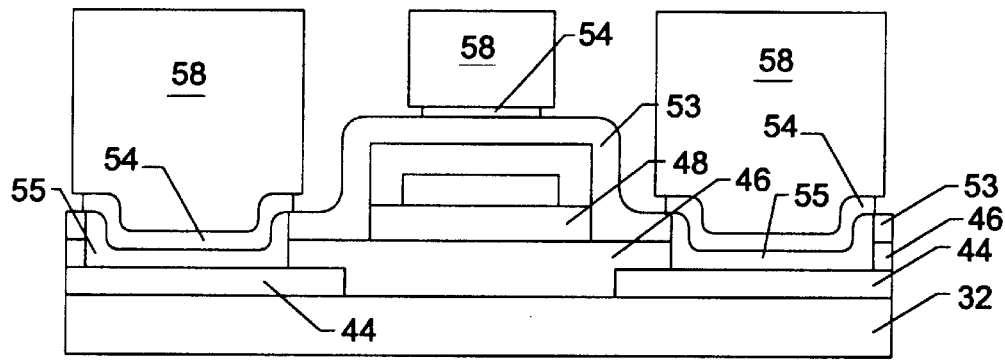
Figure 6F:
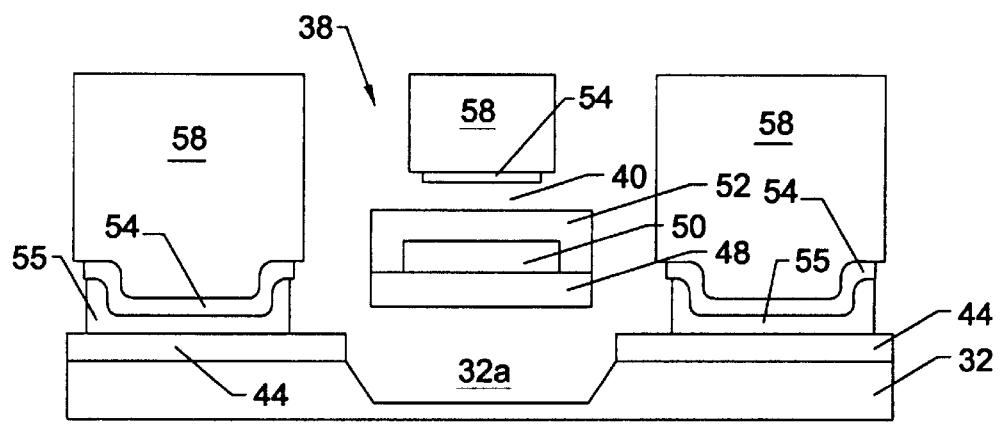

An alternative method of fabricating MEMS structures, such as MEMS actuators 30, according to the present invention is illustrated in FIGS. 6A–6F. Once the heater 38 has been fabricated as shown in FIG. 6A and as described above, a second oxide layer 53 is deposited as shown in FIG. 6B. Windows are thereafter lithographically defined and etched in the first and second oxide layers at spaced apart locations corresponding to the spaced apart supports 34. As shown in FIGS. 6C and 6D, a metal layer 55, such as chromium and/or copper, is then deposited within these windows prior to depositing the plating base 54. Once the metallic components, such as the arched beams and the spaced apart supports, have been lithographically defined and electroplated as described above, the exposed portions of the plating base are etched so as to expose the second oxide layer without significantly undercutting the metallic components. See FIG. 6E. Thereafter, the first and second oxide layers can be etched or otherwise removed to release the arched beams 36 and the heater, but not the spaced apart supports, from the substrate 32 as shown in FIG. 6F.

According to this embodiment, the arched beams 36 can be released without having to precisely time the etch of plating base 54 such that the portion of the plating base underlying the arched beams is removed without removing a significant portion of the plating base that underlies the spaced apart supports 34. In addition, the method of this advantageous embodiment is particularly well suited to forming MEMS structures, such as the MEMS valves described hereinbelow, in which the metallic component to be released is larger than the metallic component that will be supported by the substrate 32.

By fabricating a MEMS actuator 30 according to the advantageous methods described above, metallic arched beams 36 can be formed which have relatively high aspect ratios, such as 1.5:1 or greater. By having relatively high aspect ratios, the arched beams permit motion in the plane, but are relatively stiff outside of the plane. The fabrication method of the present invention also permits an external heater 38 to be formed on a portion of the substrate 32 underlying the metallic arched beams and to be precisely spaced from the metallic arch beams by a small air gap 40 such that the heat generated by the heater is efficiently transferred to the arched beams. In addition, concurrent with the fabrication of a MEMS actuator as described above, the method of the present invention can also advantageously cofabricate the other portions of the MEMS structures of the present invention, such as the MEMS relays, the MEMS switching arrays and the MEMS valves, thereby further increasing the efficiency of the fabrication process.

Figure 7A:
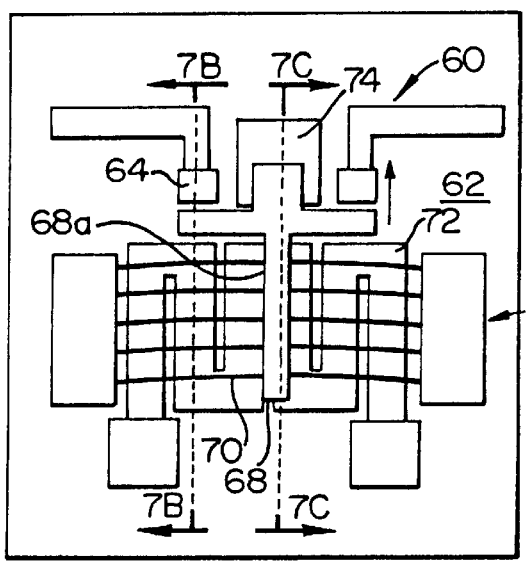
FIG. 7A is a top view and FIGS. 7B and 7C are cross-sectional views of a MEMS relay in an open position wherein the MEMS relay includes a MEMS actuator according to one embodiment of the present invention.

A number of MEMS devices can include the MEMS actuator 30 described herein above in order to take advantage of its efficient operating characteristics. For example, a MEMS relay 60 is also provided according to one embodiment of the present invention. As shown in FIG. 7A, a MEMS relay includes a microelectronic substrate 62, a first pair of contacts 64 on the substrate and a MEMS actuator 66 including an actuator member 68 for controllably establishing electrical contact between the first pair of contacts. Typically, the first pair of contacts are metallic pads that may also serve as bonding pads. As will be apparent to those skilled in the art, the first pair of contacts are preferably spaced from the substrate by a dielectric layer, such as a layer of silicon nitride, so as to electrically isolate the first pair of contacts from the substrate. Additionally, while the contacts can be formed of any of a variety of conductive materials, the contacts of one advantageous body are formed of nickel and are coated with a noble metal, such as gold or rhodium, that resists the formation of oxide layers thereon.

In the embodiment illustrated in FIG. 7A, the MEMS relay 60 is normally open. That is, the MEMS relay is in an open position if the MEMS actuator 66 has not been actuated and the arched beams 70 have not further arched. Upon heating the arched beams, such as by passing a current through the heater 72, the arched beams further arch, thereby moving the actuator member 68 toward the first pair of contacts 64. According to one advantageous embodiment, the actuator member includes a lengthwise extending portion 68a coupled to the arch beams and an enlarged contact portion 68b for contacting the first pair of contacts. Although one embodiment of the enlarged contact portion is shown in FIG. 7A, the enlarged contact portion can have a variety of shapes and sizes. As shown in FIG. 8A, further arching of the arch beams causes the enlarged contact portion of the actuator member to establish contact between the first pair of contacts, thereby closing the contact.

In the absence of other forces, the "normally open" MEMS relay 60 of FIGS. 7 and 8 would return to the open position if the arched beams 70 were no longer heated, such as by no longer passing current through the heater 72. In order to retain the MEMS relay in the closed position as shown in FIG. 8A once the arched beams are no longer heated and to improve the vibration/shock resistance of the MEMS relay, the MEMS relay can include means for holding the enlarged contact portion 68b of the actuator member 68 in position, such as the closed position, in the absence of further actuation of the MEMS actuator 66. The means for holding the actuator member in position can include means for applying an electrostatic force between the actuator member and the substrate 62 to thereby draw the actuator member and, more preferably, the enlarged contact portion of the actuator member toward the substrate and to hold at least a portion of the actuator member against the substrate. By holding the actuator member against the substrate, it is contemplated that the actuator member will generally be held against one or more layers, typically including a dielectric layer, that has been deposited upon the surface of the substrate.

As shown in FIGS. 7B, 7C, 8B and 8C, the means for applying an electrostatic force advantageously includes an electrode 74 disposed on the surface of the substrate 62. As shown, at least a portion of the electrode is preferably disposed upon the substrate between the first pair of contacts 64. Although the electrode could be buried within the substrate, the electrode of the illustrated embodiment is disposed on the substrate and is separated therefrom by a dielectric layer 76, typically formed of silicon nitride. Upon application of a pull-down voltage to the electrode, the enlarged head portion 68b of the actuator member 68 is pulled downwardly toward the electrode. As illustrated, the electrode is also generally covered with a dielectric layer 78, such as silicon nitride, to insulate the electrode from the enlarged head portion of the actuator member. The air gap between the enlarged head portion of the actuator member and the electrode is preferably sufficiently small, on the order of 1,000–3,000 Angstroms, so that only a few tens of volts may be necessary to clamp the enlarged head portion to the substrate.

Once clamped, the MEMS actuator 66 can be deactuated by halting current flow through the heater 72 and the MEMS relay 60 will remain in a closed position. By holding the MEMS relay in a closed position by the application of electrostatic forces, the power requirements of the MEMS relay are significantly decreased in comparison with the power required to continuously actuate the MEMS actuator.

In order to assist in maintaining the MEMS relay 60 in a closed position, the MEMS relay can also include at least one and, more typically, two or more retaining members 80 that extend across a portion of the substrate 62 which underlies the actuator member 68. For example, the retaining members of the illustrated embodiment are elongate members that extend across a portion of the width of the enlarged head portion of the actuator member. As shown in FIGS. 7B, 7C, 8B and 8C, the lower surface of the actuator member facing the substrate preferably includes one or more recesses 82, such as one or more grooves, for receiving respective ones of the retaining members once the MEMS relay is in the closed position and the actuator member has been bent downwardly toward the substrate by a clamp down voltage that has been applied by the electrode 74. The retaining members serve to mechanically engage the actuator member, thereby assisting the electrostatic forces applied by the electrode to retain the MEMS relay in a closed position so long as the actuator member remains clamp to the substrate.

Figure 7B:
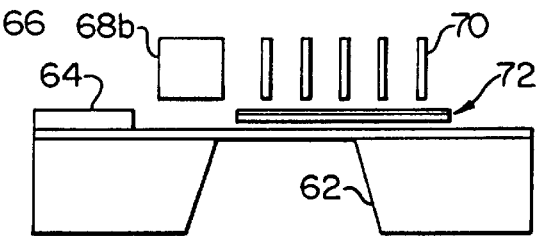
Figure 7C:
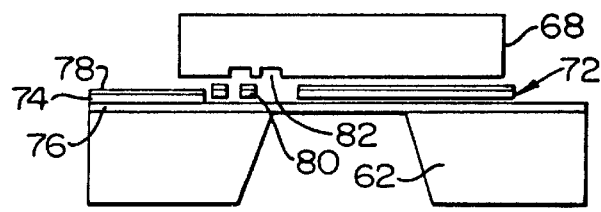

In order to thereafter open the MEMS relay 60, the clamp down voltage applied by the electrode 74 is removed such that the actuator member 68 lifts upwardly away from the surface of the substrate 62. The actuator member will then be retracted by means of the restoring forces provided by the arched beams 70 to the open position as shown in FIGS. 7A–7C. While the MEMS relay of FIGS. 7 and 8 is a normally open relay as described above, the MEMS relay can be a normally closed relay that is opened only upon actuation of the MEMS actuator 66, such as by heating the arched beams without departing from the spirit and scope of the present invention.

The MEMS relay 60 of the present invention provides numerous advantages in comparison with electrostatic or magnetically actuated microrelays. As a result of the large displacements provided by the MEMS actuator 66 of the present invention, a larger separation can be maintained with the first pair of contacts 64, thereby increasing the standoff voltage capability of the MEMS relay. Additionally, the relatively large forces provided by the MEMS actuator provides good relay or switch closure, thereby ensuring low contact resistance.

Although the actuator member 68 of the MEMS relay 60 described hereinabove can be a unitary structure as shown in FIGS. 7 and 8, the lengthwise extending portion 68a and the enlarged head portion 68b can be separate structures as shown in FIGS. 9A–9C. According to this embodiment, the lengthwise extending portion of the actuator member is connected to the plurality of arched beams 70. However, the enlarged head portion is not connected to the lengthwise extending portion of the actuator member. Instead, the enlarged head portion is suspended adjacent to the first pair of contacts 64 by a pair of springs 84 as shown in FIG. 9A. Typically, the springs are formed of a metal, such as nickel, during the electroplating step. The springs extend from opposed edges of the enlarged head portion to respective anchor members 86 that extend upwardly from the substrate 62. Typically, the anchor members are spaced from the substrate by means of the plating base and/or a dielectric layer.

Other than the attachment of the anchor members 86 to the substrate 62, the remainder of the enlarged head portion 68b is freed from the substrate. As such, by passing current through the heater 72 and causing the arched beams 70 to further arch, the end portion of the lengthwise extending portion 68a contacts a rear surface of the enlarged head portion and urges the enlarged head portion into contact with the first pair of contacts 64. See FIG. 9B. As described above in conjunction with FIGS. 7 and 8, the MEMS relay 60 of this embodiment can also include means for holding the enlarged head portion of the actuator member in position once current is removed from the heater and the lengthwise extending portion of the actuator member returns to a rest or neutral position as shown in FIG. 9C. As shown in FIGS. 9A–9C, the holding means can include an electrode 74 for applying an electrostatic clamp down force as described above. Once the clamp down force is removed, however, the enlarged head portion returns to an open position as shown in FIG. 9A as a result of the restoring forces provided by the springs 84.

As described above in conjunction with the MEMS relay of FIGS. 7 and 8, the MEMS relay 60 of FIG. 9 is described in conjunction with a normally open MEMS relay. However, the MEMS relay of this embodiment can, instead, be normally closed, if so desired, without departing from the spirit and scope of the present invention.

Figure 10:
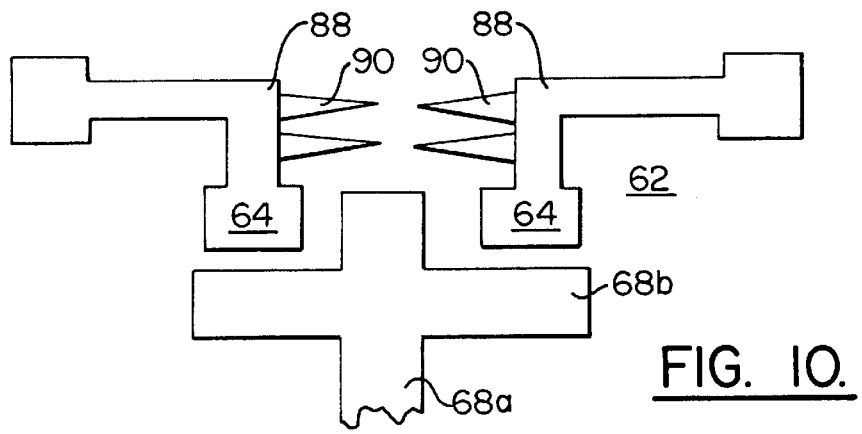
FIG. 10 is top view of a portion of a MEMS relay of one embodiment of the present invention that includes first and second field intensification structures for providing overvoltage protection.

According to either embodiment, the MEMS relay 60 can also include first and second field intensification structures 88 for providing overvoltage protection. As illustrated in FIG. 10, the first and second field intensification structures are electrically connected to respective ones of the first pair of contacts 64 and are disposed of in a facing relationship relative to one another. More particularly, each field intensification structure preferably includes at least one pointed projection 90 extending toward the other field intensification structure. As such, excessive voltages that build up across the first pair of contacts will not create a spark and break down between the enlarged head portion 68b of the actuator member 68 and the first pair of contacts. Instead, the first and second field intensification structures serve as a fuse by defining a discharge gap which will break down in overvoltage conditions prior to any break down between the enlarged head portion of the actuator member and the first pair of contacts.

Typically, the field intensification structures 88 are formed of a metal, such as nickel, and are separated from the substrate 62 by means of a dielectric layer, such as silicon nitride. In addition, the pointed projections 90 of each field intensification structure are generally conical projections that extend to a point as shown in FIG. 10. However, the field intensification structures can include other types of projections without departing from the spirit and scope of the present invention.

Figure 11:
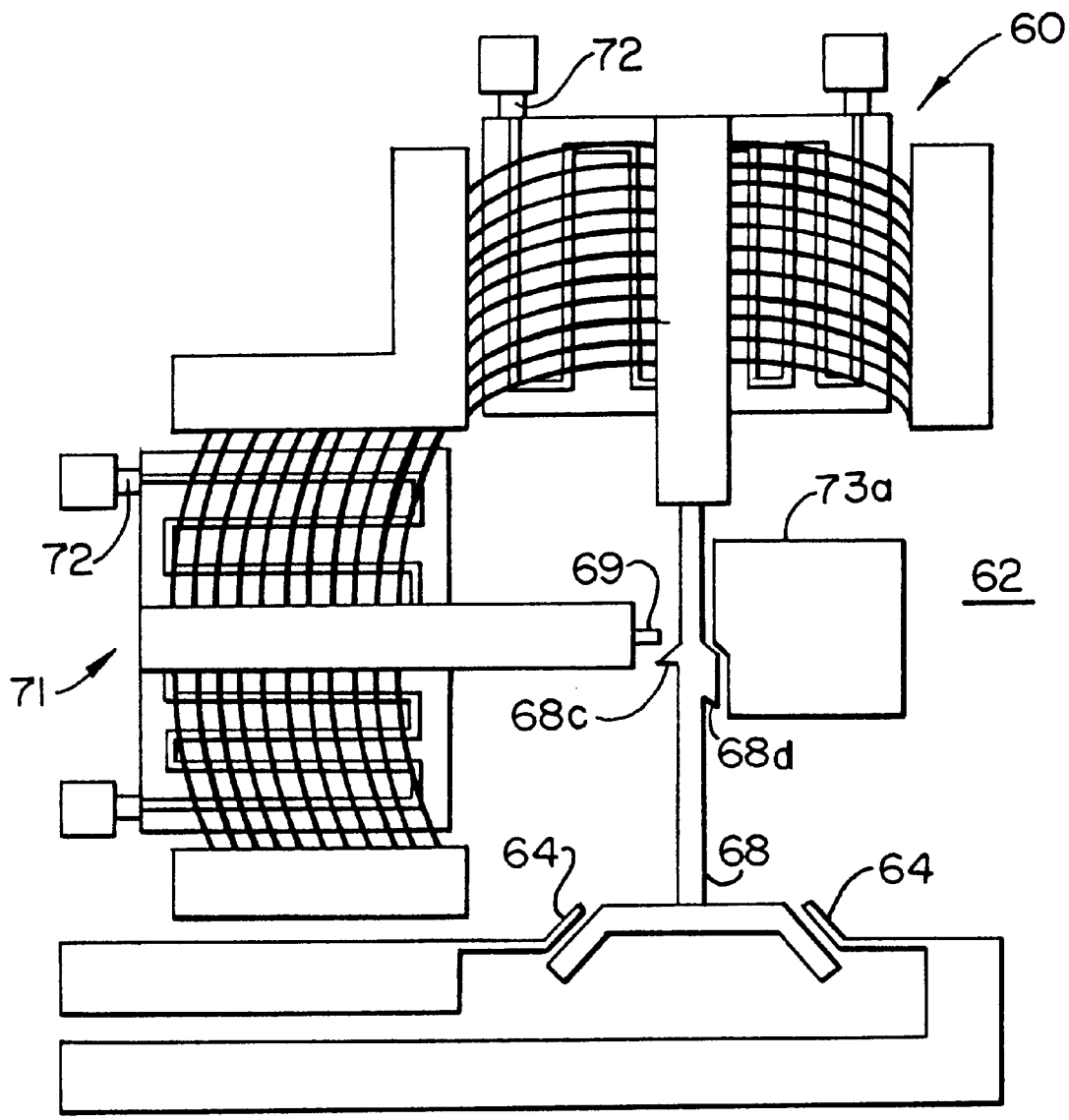
FIG. 11 is a top view of a MEMS relay of another embodiment of the present invention that includes latch means and reset means.

The MEMS relay 60 can also include latch means for latching the actuator member 68 in position following heating of the arched beams 70 and movement of the actuator member. Heating the arched beams of one embodiment of the MEMS relay will move the MEMS relay from a normally open position as shown in FIG. 11 to a closed position in which the actuator member is in electrical contact with the contact members 64. In this regard, the actuator member will make sliding contact with the contact members, thereby at least partially removing any oxide layer that may have developed upon the contact members. Although not illustrated, the MEMS relay can be normally closed, if so desired.

The latch means of the MEMS relay 60 of FIG. 11 includes a latch member 69 and a corresponding projection 68c extending outwardly from the actuator member such that movement of the actuator member will advance the outwardly extending projection beyond the latch member. As shown, the outwardly extending projection is preferably tapered to facilitate movement of the outwardly extending projection relative to the latch member. Once the outwardly extending projection of the actuator member has advanced beyond the latch member, the latch member preferably engages a shoulder defined by the projection such that the actuator member will remain in position once the MEMS relay is no longer actuated. By latching the actuator member in position, electrical contact will be maintained between the contact members 64 without having to continue actuating the MEMS relay, thereby further reducing power requirements of the MEMS relay.

The MEMS relay 60 of this embodiment can include a bearing 73 that is positioned upon the substrate 62 adjacent the actuator member 68 on the opposite side from the latch member 69. The bearing defines an angled bearing surface 73*a* that cooperates with a bearing surface 68*d* defined by the actuator member in order to insure that shoulder of the outwardly extending projection 68*c* engages the latch member once the projection has been advanced beyond the latch member.

The MEMS relay 60 of this embodiment also preferably includes reset means for disengaging the latch member 69 and the outwardly extending projection 68*c* so as to permit the MEMS relay to return to a rest position. As shown in FIG. 11, the reset means can include a second MEMS actuator 71 having an actuator member that includes a latch member. As such, actuation of the second MEMS actuator moves the latch member away from the outwardly extending projection such that the latch member and the projection disengage, thereby permitting the MEMS relay to return to the rest position, i.e., the open position in this embodiment, in the absence of further actuation.

Figure 12:
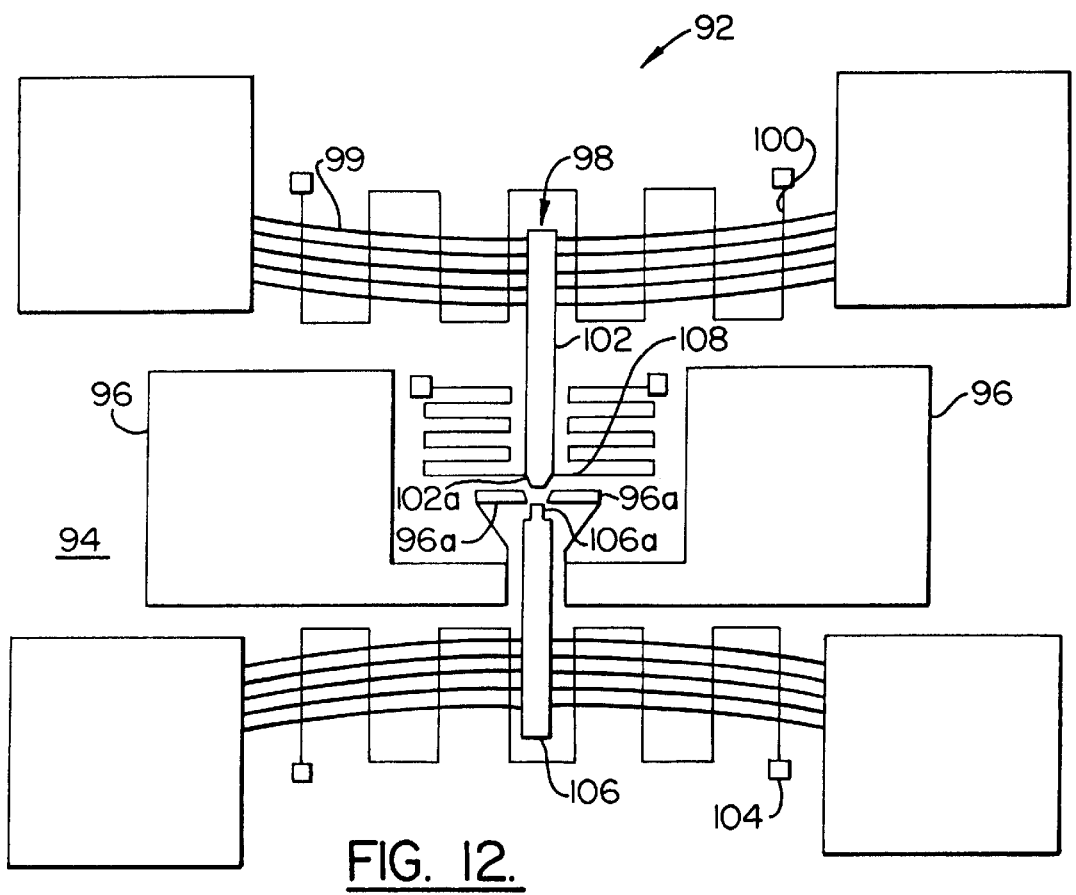
FIG. 12 is a top view of a MEMS relay of another advantageous embodiment of the present invention.

A MEMS relay 92 of another embodiment is illustrated in FIG. 12. The MEMS relay of this embodiment includes first and second MEMS actuators disposed on the substrate 94 on opposite sides of the first pair of contacts 96 . In order to establish electrical contact between the first pair of contacts, the first MEMS actuator 98 is actuated, such as by passing current through the heater 100. Upon actuation, the end portion 102*a* of the actuator member 102 of the first MEMS actuator is inserted between the first pair of contacts, thereby establishing electrical contact therebetween.

As shown in FIG. 12, the first pair of contacts 96 preferably includes a pair of outwardly extending contact arms 96*a* that are free from the substrate and extend thereover in a cantilevered fashion. As also shown, the contact arms of the first pair of contacts define a gap having a width that is slightly less than the width of the tapered end portion 102*a* of the actuator member 102 of the first MEMS actuator 98. As will therefore be apparent, insertion of the tapered end portion of the actuator member between the first pair of contacts upon actuation of the first MEMS actuator will force the respective contact arms apart. As a result, the inward restoring forces of the contact arms will serve to engage the end portion of the actuator member between the contact arms such that the MEMS relay will remain in a closed position, that is, the tapered end portion of the actuator member of the first MEMS actuator will remain held between the first pair of contacts, even after the first MEMS actuator is deactuated.

In order to facilitate insertion of the actuator member 102 between the first pair of contacts 96, the actuator member 102 of the first MEMS actuator 98 preferably has a tapered end portion 102*a*. See FIG. 12. In addition, the edge surfaces of the contact arms 96*a* that receive and electrically contact the actuator member of the first MEMS actuator are preferably correspondingly tapered. As such, the tapered end portion of the actuator member of the first MEMS actuator will snugly fit between and engage the first pair of contacts.

In order to open the MEMS relay 92 of this advantageous embodiment, the second MEMS actuator 104 is preferably actuated so as to advance the respective actuator member 106. As the actuator member of the second MEMS actuator advances, the end portion of the actuator member will contact the tapered end portion 102*a* of the actuator member 102 of the first MEMS actuator 98 so as to disengage the tapered end portion of the actuator member of the first MEMS actuator from the first pair of contacts 96. Once disengaged, the restoring forces provided by the arched beams 99 serve to further retract the actuator member of the first MEMS actuator to the neutral position shown in FIG. 12.

In order to facilitate contact with the actuator member 102 of the first MEMS actuator 98, the end portion of the actuator member 106 of the second MEMS actuator 104 preferably includes a reduced width portion 106*a* having a width that is less than the gap between the contact arms 96*a*. As such, the reduced width portion of the actuator member of the second MEMS actuator can contact the actuator member of the first MEMS actuator without contacting or otherwise engaging the first pair of contacts.

Since the actuator member 102 of the first MEMS actuator 98 is relatively long, the MEMS relay 92 can also include a suspension spring 108 that is connected to the end portion 102*a* of the actuator member. The suspension spring serves to more precisely position the tapered end portion of the actuator member relative to the first pair of contacts 96 and to assist in the return of the tapered end portion of the first MEMS actuator to a neutral position.

Figure 13:
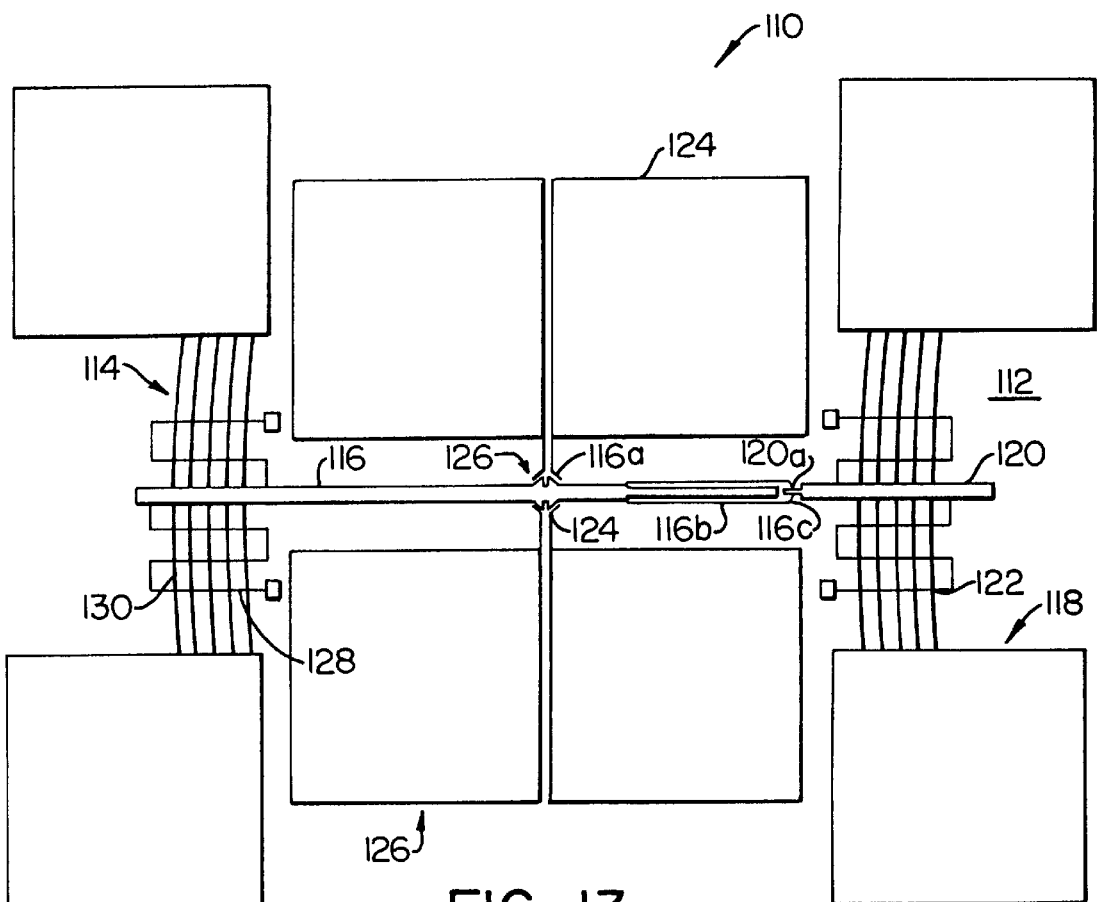
FIG. 13 is top view of a MEMS relay of yet another advantageous embodiment of the present invention.

FIG. 13 illustrates a MEMS relay 110 of yet another embodiment for alternately connecting first and second pairs of contacts. According to this embodiment, the MEMS relay includes a substrate 112 and first and second pairs of contacts on the substrate. As described above, the contacts are preferably isolated from the substrate, such as by means of a dielectric layer formed of silicon nitride, for example.

The MEMS relay 110 of this embodiment also includes first and second MEMS actuators disposed on the substrate 112 on opposite sides of the first and second pairs of contacts. As shown in FIG. 13, the actuator member 116 of the second MEMS actuator 114 extends toward the first and second pairs of contacts and includes an enlarged head portion 116*a* disposed between the first and second pairs of contacts. The actuator member of the second MEMS actuator also includes a sleeve 116*b* mounted to the end portion of the actuator member and opening through the end 116*c* thereof. Correspondingly, the actuator member 120 of the first MEMS actuator 118 preferably includes a somewhat enlarged engagement portion 120*a* such that actuation of the first MEMS actuator advances the actuator member in a direction towards the second MEMS actuator so as to insert the engagement portion through the end of the sleeve.

Figure 14:
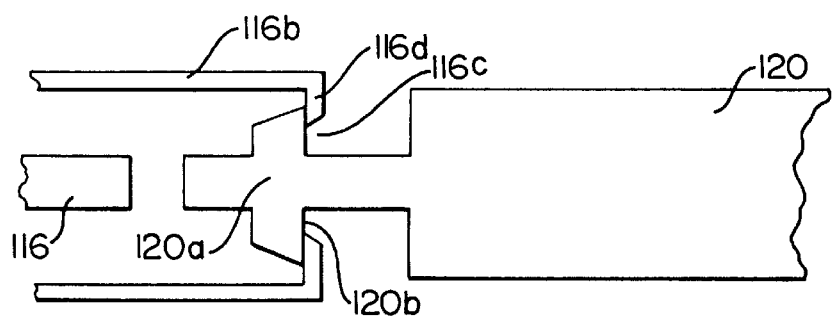
FIG. 14 is an enlarged plan view of a portion of the MEMS relay of FIG. 13 illustrating one advantageous embodiment of the latch means.

As shown in more detail in FIG. 14, the open end 116*c* of the sleeve 116*b* preferably includes an inwardly extending flange 116*d*. In addition, the engagement portion 120*a* of the actuator member 120 of the first MEMS actuator 118 is preferably tapered or flared to facilitate the insertion of the engagement portion through the open end of the sleeve. As also shown in FIG. 14, the engagement portion of the actuator member of the first MEMS actuator also preferably defines a shoulder 120*b* for cooperably engaging the inwardly extending flange of the open end of the sleeve. As such, the actuator members of the first and second MEMS actuators will remain cooperably engaged following deactuation of the first MEMS actuator.

Once the actuator members of the first and second MEMS actuators are cooperably engaged, the restoring forces of the arched beams 122 of the first MEMS actuator 118 will draw the enlarged head portion 116a of the actuator member 116 of the second MEMS actuator 114 into contact with the first pair of contacts 124 if neither MEMS actuator is actuated. As such, the first pair of contacts is referred to as the "normally closed" contact and the second pair of contacts 126 is referred to as the "normally open" contact. By actuating the second MEMS actuator, such as by passing current through the heater 128 underlying the arched beams 130 of the second MEMS actuator, or by concurrently actuating the first and second MEMS actuators, the enlarged head portion can be disengaged from the first pair of contacts and, instead, can be placed in electrical contact with the second pair of contacts. Once the second MEMS actuator is deactuated, however, contact is reestablished with the first pair of contacts, as described above.

Figure 15:
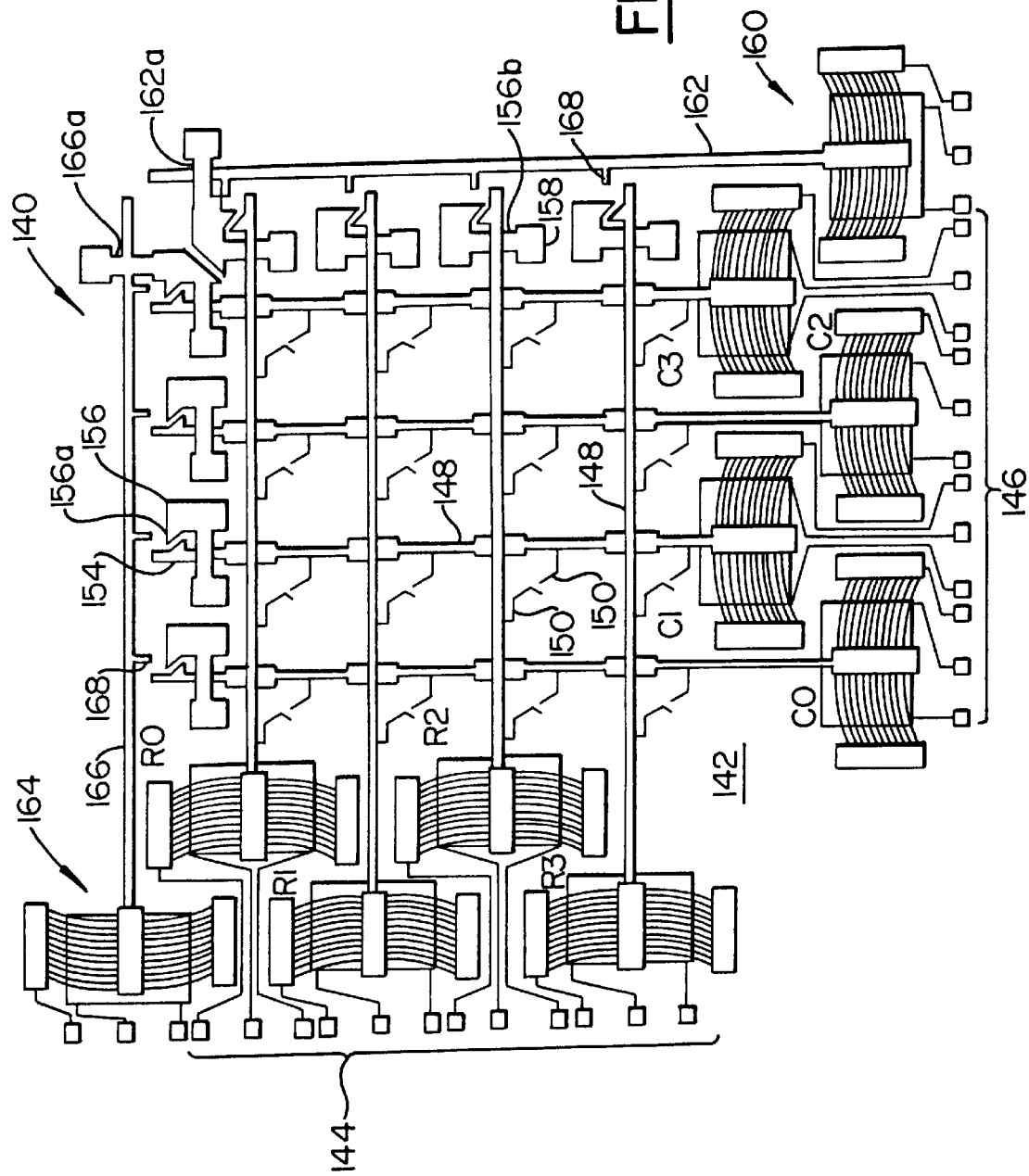
FIG. 15 is a top view of a 4×4 switching array in the open position according to one advantageous embodiment of the present invention.

According to another aspect of the present invention shown in FIG. 15, a plurality of the MEMS actuators can be assembled to define a MEMS switching array 140. According to this embodiment, a number of first and second MEMS actuators are positioned on the substrate 142 such that the first MEMS actuators 144 define respective row elements and the second MEMS actuators 146 define respective column elements. As shown in FIG. 15, for example, a first set of four MEMS actuators define four row elements (R0, R1, R2 and R3) and a second set of four MEMS actuators define four column elements (C0, C1, C2 and C3), thereby defining a 4×4 switching array. As will be apparent, the switching array of this embodiment need not have the same number of row and column elements and, in fact, can have any number of row and column elements that are desired. As described below, actuation of a respective pair of first and second MEMS actuators moves the respective actuator members and establishes electrical contact between respective contact members. As a result, a continuous electrical path is established between the respective pair of first and second MEMS actuators.

The actuator member 148 of each MEMS actuator preferably includes a plurality of contact members 150 spaced along the actuator member and extending outwardly therefrom. For a MEMS actuator defining a respective row element, the actuator member preferably includes the same number of contact members as column elements. Likewise, for a MEMS actuator defining a respective column element, the actuator member preferably includes the same number of contact members as row elements. As shown in FIG. 15, for example, each actuator member includes four contact members spaced along the actuator member and extending outwardly therefrom. As such, the switching array of the present invention does not require a separate actuator for each switch of the switching array, thereby simplifying the switch design in comparison with some conventional switching arrays.

Figure 16:
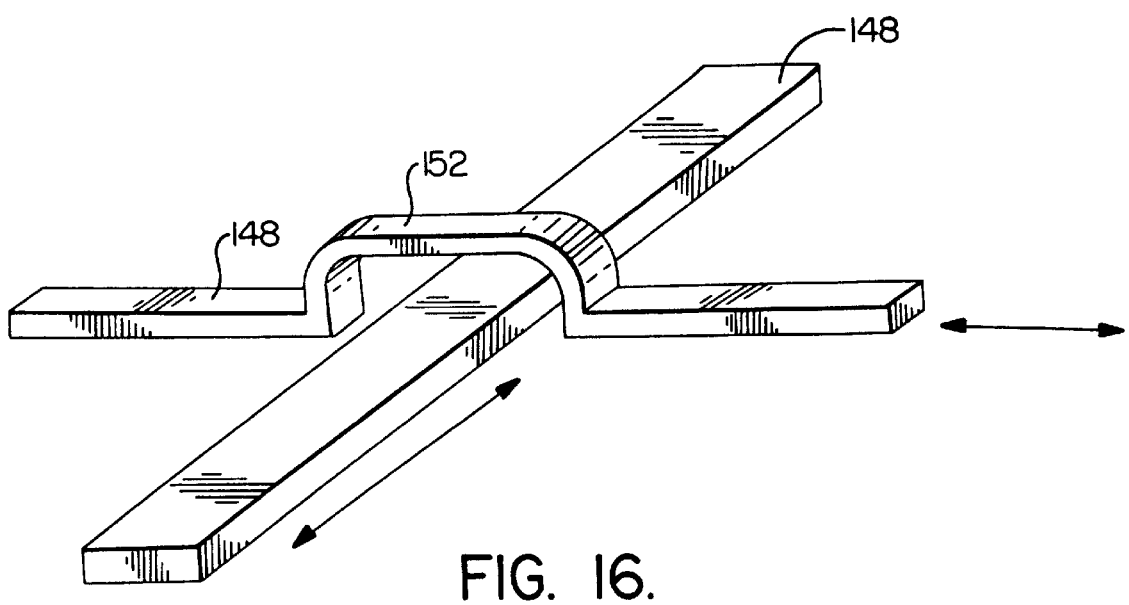
FIG. 16 is an enlarged perspective view of a portion of the switching array of FIG. 15 illustrating one technique for permitting the actuator members of the first and second actuators to cross over.

The actuator member 148 of each MEMS actuator preferably extends across the entire array. In order to permit the actuator members of the first and second MEMS actuators to cross, the actuator member of each first MEMS actuator 144 preferably includes a plurality of arched portions 152 to permit the actuator member to cross over the actuator members of the second MEMS actuators 146 as shown in FIG. 16. As will be apparent, however, the actuator member of each second MEMS actuator could instead include a plurality of arched portions to permit the actuator member to cross over the actuator members of the first MEMS actuators, if so desired. As shown in FIG. 16, the width of the arched portions of the actuator member are preferably sufficient to permit each actuator member to have full freedom of motion and to provide sufficient dielectric isolation. As such, the actuator members of the first MEMS actuators that define respective row elements and the actuator members of the second MEMS actuators that define respective column elements are free to move relative to one another. Preferably, the arched portions of the actuator member are formed by electroplating a second layer of metal, such as nickel, which connects the remainder of the actuator member that was deposited in a previous electroplating step.

Figure 17:
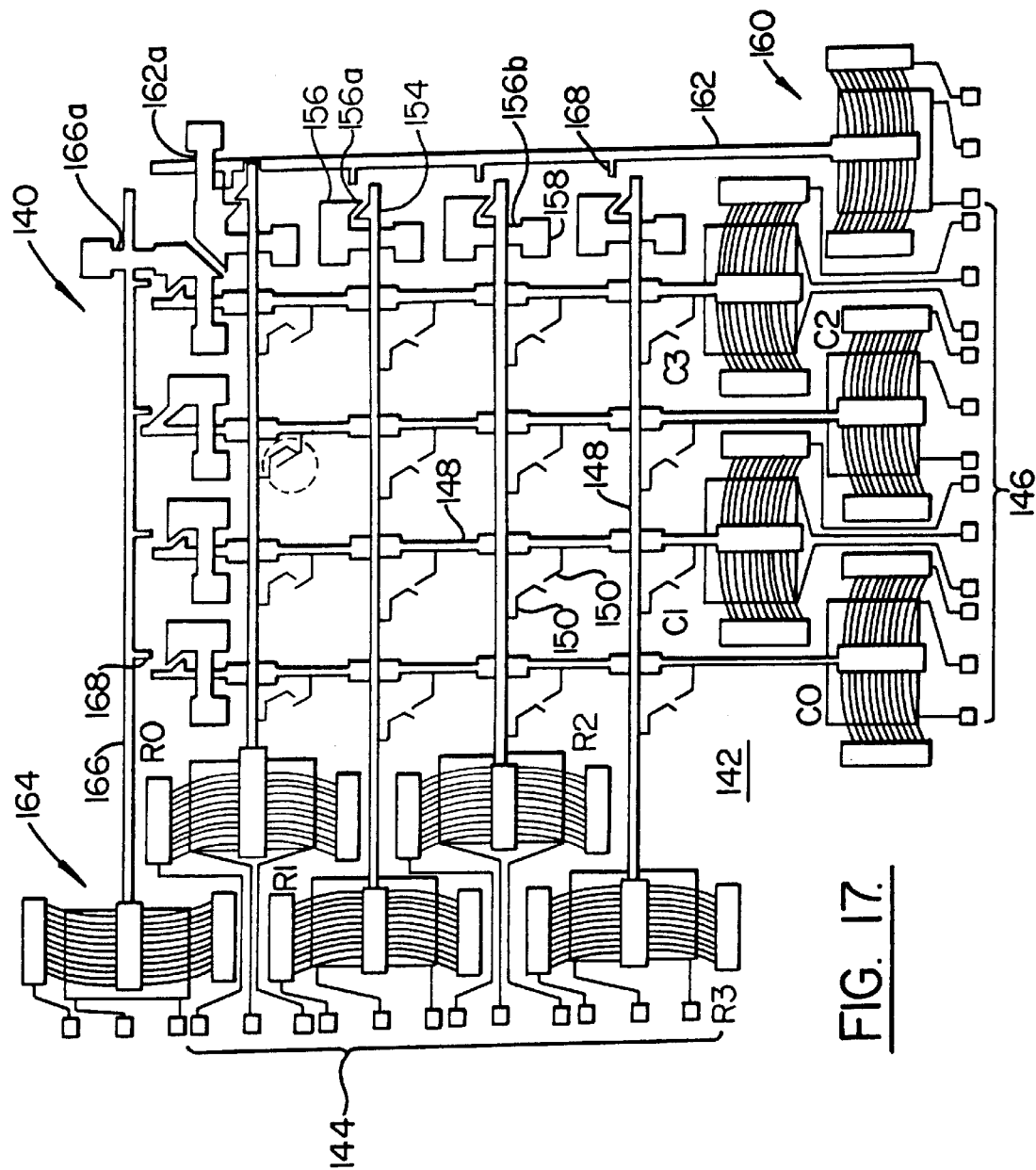
FIG. 17 is a top view of the switching array of FIG. 15 in which electrical contact has been established between the first row and the third column.

By way of example, the first MEMS actuator 144 that defines the first row element (R0) and the second MEMS actuator 146 that defines the third column element (C2) have been actuated such that electrical contact is established between the respective contact members 150 as circled in FIG. 17. In particular, the contact members are preferably moved into contact with a wiping-type motion to thereby remove any oxide that may have formed on the surfaces of the respective contact members. It should be apparent, however, that more than one pair of row and column elements can be concurrently connected by actuating additional ones of the first and second MEMS actuators, thereby providing a "one-to-many" connection if so desired.

In order to maintain electrical contact between the contact members 150 without requiring that the respective pair of first and second MEMS actuators be continually actuated, the MEMS switching array 140 of one advantageous embodiment includes latch means for latching the actuator members 148 of the respective pair of first and second MEMS actuator following actuation thereof. The respective pair of first and second MEMS actuators can then be deactuated and the respective contact members will remain electrical contact. As shown in FIGS. 15 and 17, the latch means of one advantageous embodiment includes a latch member 154, such as a tapered projection, extending outwardly from an end portion of each respective actuator member. The latch means of this embodiment also include a plurality of anchor members 156 formed on the substrate 142 with one anchor member associated with the latch member of each respective MEMS actuator. As shown, the anchor members also preferably include an outwardly extending tapered projection 156a. The tapered projection of the anchor members cooperates with the latch member of the respective actuator member as the actuator member is advanced to thereby deflect, albeit slightly, the end portion of the actuator member such that the latch member can be advanced beyond the anchor member. Once the latch member is advanced beyond the respective anchor member, the anchor member will serve to prevent the latch member from being retracted, such as upon deactuation of the respective MEMS actuator, due to the cooperable engagement of the anchor member with the latch member.

The anchor member 156 is typically formed of an electroplated metal, such as nickel, that is separated from the substrate 142 by a dielectric layer, such as silicon nitride, and/or a plating base. In order to prevent the end portion of the respective actuator member 148 from deflecting excessively in a direction away from the substrate, the anchor member also preferably includes an arched portion 156b that crosses over the end portion of the actuator member in the same fashion as was illustrated in FIG. 16 with respect to a pair of orthogonal actuator members. As shown in FIGS. 15 and 17, the end of the arched portion opposite the anchor member is preferably attached to another support 158. In one advantageous embodiment, this other support is also typically formed of metal, such as electroplated nickel, that is separated from the substrate by means of a dielectric layer, such as silicon nitride, and/or a plating base.

For embodiments of the MEMS switching array 140 that include latch means, the MEMS switching array also preferably includes reset means for unlatching the actuator members 148 such that the respective contact members 150 separate and no longer make electrical contact in the absence of further actuation of respective ones of the MEMS actuators. As shown in FIGS. 15 and 17, the reset means preferably includes first and second reset MEMS actuators for resetting the plurality of first and second MEMS actuators, respectively. As shown, the actuator member 162 of the first reset MEMS actuator 160 preferably extends in a lengthwise manner adjacent to and generally perpendicular to the end portions of each of the actuator members of the first MEMS actuators 144. Likewise, the actuator member 166 of the second reset MEMS actuator 164 preferably extends in a lengthwise fashion adjacent to and generally perpendicular to the end portions of each of the actuator members of the second MEMS actuators 146.

In order to prevent the end portion of the actuator member 162 of the first reset MEMS actuator from deflecting excessively in a direction away from the substrate 142, an arched member 162a preferably extends between a pair of anchor members that are positioned upon the substrate such that the arched member crosses over the end portion of the actuator member of the first reset MEMS actuator in the same fashion as was illustrated in FIG. 16 with respect to a pair of orthogonal actuator members. Likewise, another arched member 166a preferably extends between a second pair of anchor members that are positioned upon the substrate such that the arched member crosses over the end portion of the actuator member 166 of the first reset MEMS actuator 164.

The actuator member of each of the first and second reset MEMS actuators includes a plurality of reset members 168 spaced along the actuator member and extending outwardly therefrom in a direction toward the switching array 140. In particular, the spacing of the reset members is preferably the same as the spacing of the respective actuator members that will be reset thereby. According to one advantageous embodiment, the reset members are posts that extend outwardly in a direction generally perpendicular to the actuator member of the respective reset MEMS actuator.

In operation, the reset MEMS actuator is actuated so as to move the respective actuator member such that the reset members 168 will engage the actuator members of the respective MEMS actuators that have been latched. With reference to FIGS. 15 and 17, for example, actuation of the first reset MEMS actuator 160 moves the respective actuator member 162 downwardly, while actuation of the second reset MEMS actuator 164 moves the respective actuator member 166 to the left. Once engaged, further movement of the actuator member of a reset MEMS actuator will deflect the end portions of the actuator members of the respective MEMS actuators in a direction away from the respective anchor member, thereby disengaging the actuator members. The restoring provided by the arched beams of the respective MEMS actuators will then return the actuator members to an unlatched, neutral position as shown in FIG. 15.

As such, the MEMS switching array 140 allows electrical contact to be established in a reliable fashion between respective pairs of the first and second MEMS actuators that define individual row and column elements, respectively. Electrical signals can then be passed via the metallic portions of the respective pair of interconnected MEMS actuators. For example, an electrical signal introduced at one of the spaced apart supports of one of the interconnected MEMS actuators is transmitted via the actuator members and contact members of the respective pair of MEMS actuators to one of the supports of the other one of the interconnected MEMS actuators. Thus, the MEMS switching array of the present invention is particularly advantageous for telecommunications and other switching applications.

According to another embodiment of the present invention, a MEMS valve 170 is provided in which at least one opening 172a is defined through the substrate 172, typically by bulk silicon micromachining or other conventional processes. According to this embodiment, the MEMS valve includes a MEMS actuator 174 having a valve plate 176 operably coupled to the arched beams 178 and, more preferably, operably coupled to the actuator member 180 such that further arching of the arched beams controllably moves or positions the valve plate relative to the substrate. Typically, the valve plate is formed of an electroplated metal, such as nickel.

Figure 18:
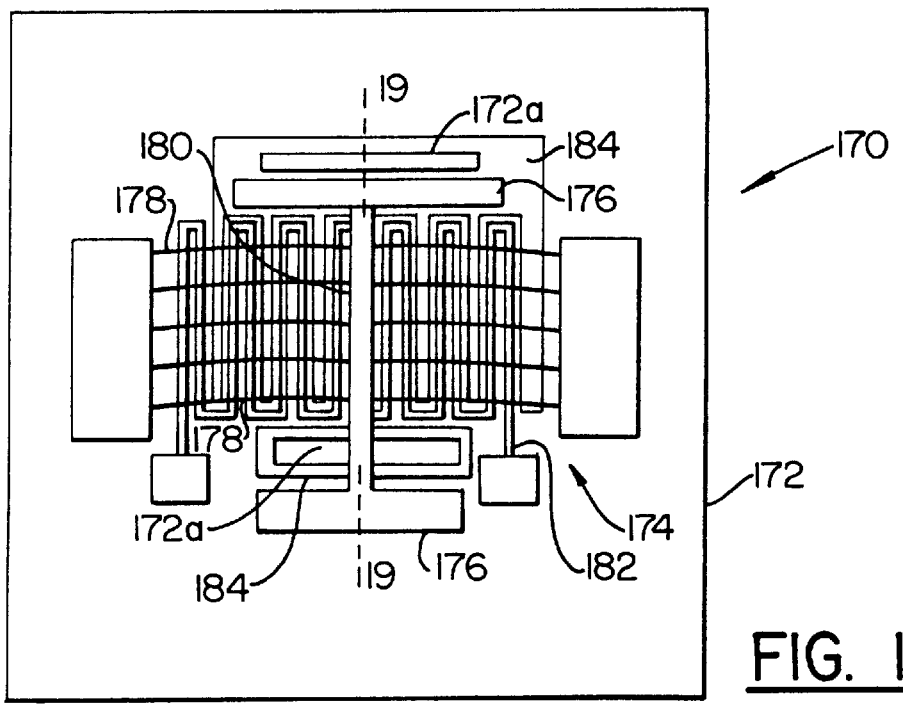
FIG. 18 is a top view of a MEMS valve of one embodiment of the present invention.

As shown in FIG. 18, the MEMS actuator 174 is advantageously positioned upon the substrate 172 relative to the opening 172a such that the valve plate 176 at least partially covers the opening and, more preferably, fully covers the opening upon actuation of the MEMS actuator, thereby forming a "normally open" valve. Alternatively, the MEMS actuator can be positioned upon the substrate relative to the opening such that the valve plate covers the opening in the absence of actuation and is removed from the opening only upon actuation of the MEMS actuator, thereby forming a "normally closed" valve.

Figure 19A:
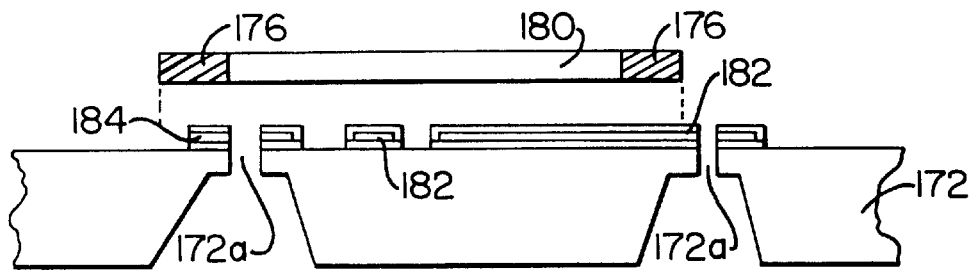
FIGS. 19A and 19B are cross-sectional views of FIG. 18 taken along line 19—19 in the open and closed positions, respectively.
Figure 19B:
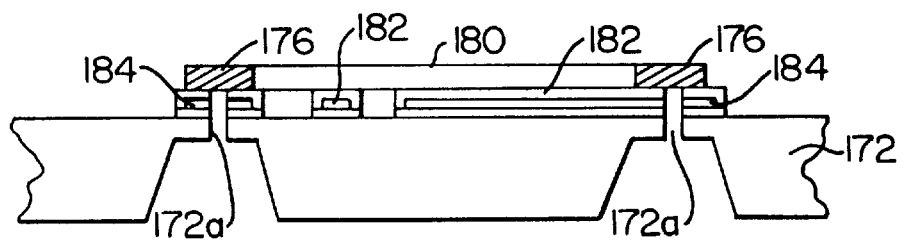

Upon actuation of the "normally open" MEMS actuator 174 of FIG. 18, such as by passing current through the heater 182, the valve plate 176 is moved over the opening 172a in the substrate 172 to close the opening as shown in FIG. 19B. As described above in conjunction with a MEMS relay, the MEMS valve 170 also preferably includes means for holding the valve plate in position relative to the opening following actuation of the MEMS actuator. For example, the means for holding the valve plate in position can include means for applying an electrostatic force between the valve plate and the substrate. As a result of the electrostatic force, the valve plate is deflected toward the substrate so as to be clamped down over the opening, thereby further restricting or preventing fluid flow there through. In order to apply the electrostatic force, a voltage differential can be applied between the valve plate and the substrate or, alternatively, between the valve plate and an electrode 184 formed on or in the portion of the substrate adjacent to and, in some embodiments, surrounding the opening in the same manner to that described above in conjunction with MEMS relays. By continuing to apply the electrostatic force, the valve plate can be held in the closed position over the opening defined by the substrate even if the MEMS actuator is deactuated, thereby further reducing the power requirements of the MEMS valve. Upon releasing the valve plate, however, such as by no longer applying a voltage differential between the valve plate and the substrate, the MEMS actuator returns to the neutral position shown in FIGS. 18 and 19A in which the opening is uncovered.

In order to provide increased fluid flow, a plurality of openings 172a can be defined by the substrate 172 as shown in FIG. 18. According to this advantageous embodiment, the MEMS actuator 174 preferably includes a plurality of valve plates 176 equal in number to the number of openings defined by the substrate. Each of the valve plates is preferably operably coupled to the arched beams 178 and, more preferably, to the actuator member 180 of the MEMS actuator such that movement of the arched beams controllably moves the valve plates with respect to respective ones of the openings. In the embodiment of FIG. 18, for example, actuation of the MEMS actuator moves the pair of valve plates over respective ones of the openings defined by the substrate, while deactuation of the MEMS actuator returns the valve plates to a rest or neutral position in which the openings are uncovered.

Figure 20:
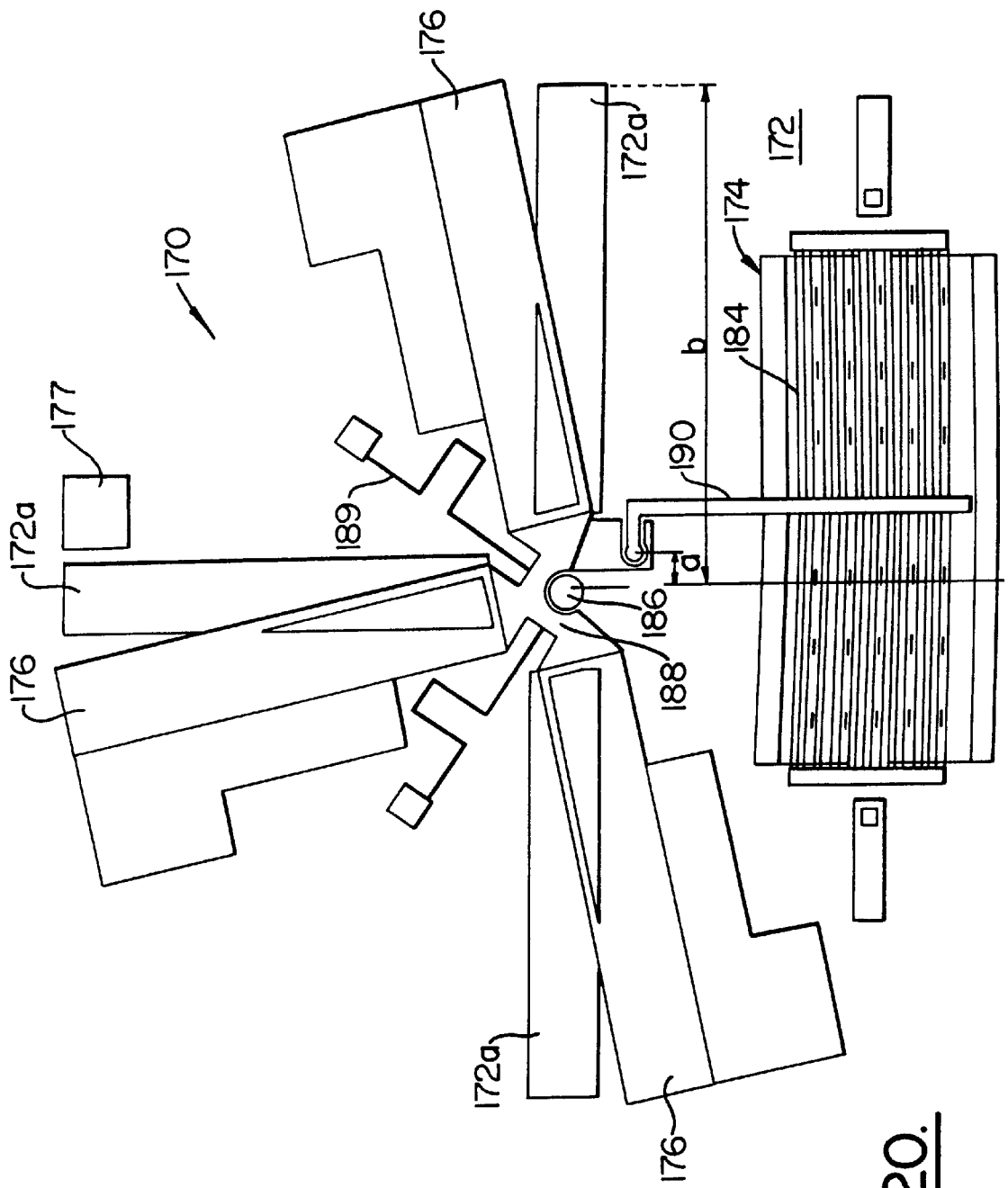
FIG. 20 is a top view of a normally open fan-type MEMS valve according to another advantageous embodiment of the present invention.
Figure 21:
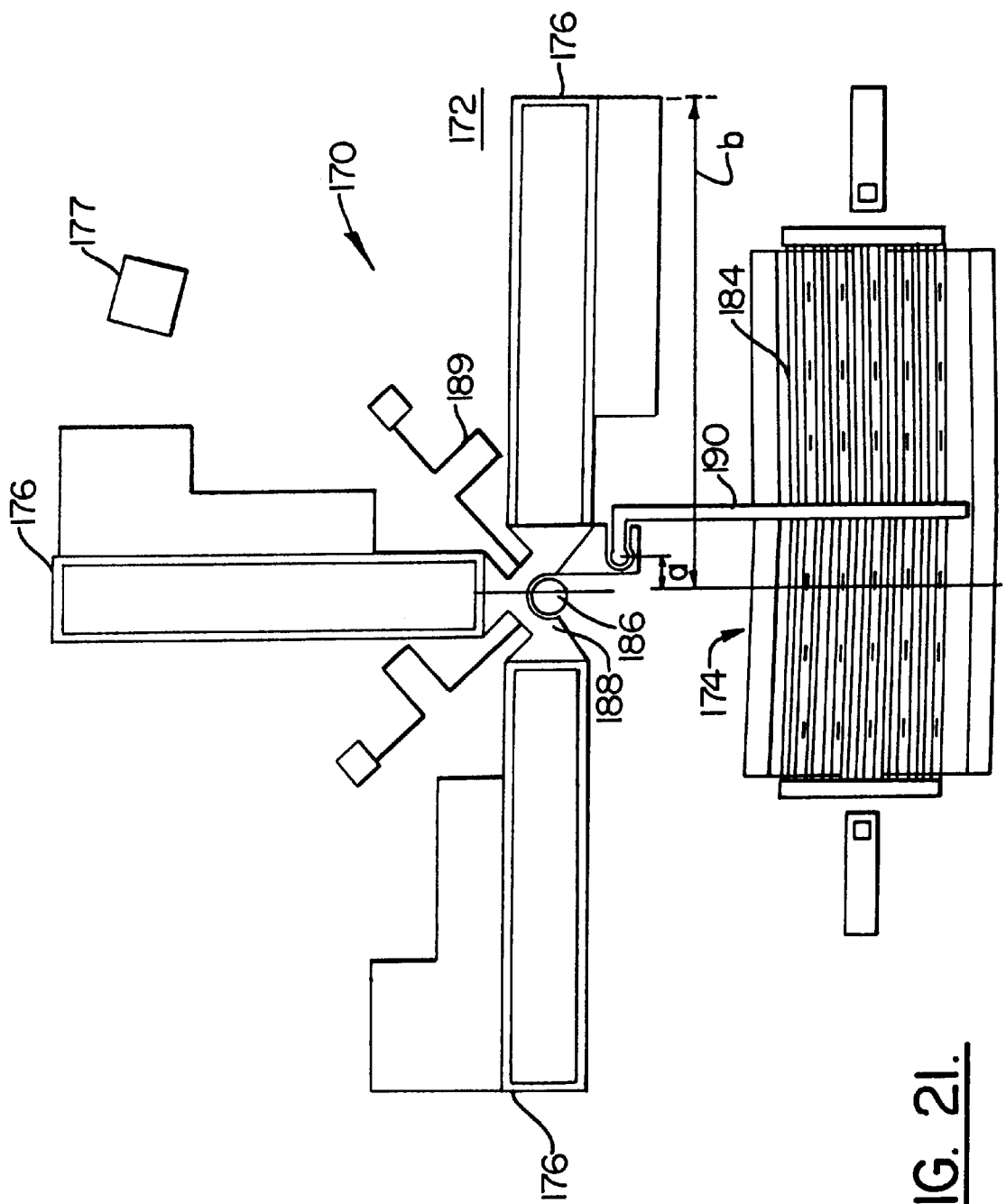
FIG. 21 is a top view of a normally closed fan-type MEMS valve according to another advantageous embodiment of the present invention.

Another embodiment of a MEMS valve 170 that provides an even further increased fluid flow through larger openings 172a defined in the substrate 172 is shown in FIGS. 20 and 21. In this embodiment, the MEMS actuator 174 has a fan-type construction in which each of the valve plates 176 pivots about a pivot point as the arched beams 184 are heated. As shown, the pivot point is typically defined by bearing post 186 extending outwardly from the substrate. Since the openings defined by the substrate of this advantageous embodiment are generally spaced angularly about the bearing post, the plurality of valve plates are preferably coupled to a center plate 188 that is adapted to pivot about the pivot point. As shown, the center plate is typically suspended by means of springs 189 above the substrate.

As further shown in FIGS. 20 and 21, the end portion of the actuator member 190 of the MEMS actuator 174 is preferably connected to the center plate 188 at a point offset from the pivot point. As such, actuation of the MEMS actuator and the resulting movement of the actuator member will pivot the valve plates about the bearing post, thereby moving the valve plates with respect to the respective openings 172a defined by the substrate 172.

In the embodiment of the fan-type MEMS valve 170 shown in FIGS. 20, the MEMS valve is normally open. As such, actuation of the MEMS actuator 174 will rotate the valve plates 176 so as to at least partially cover respective ones of the openings 172a defined by the substrate 172. Alternatively, the fan-type MEMS valve can be normally closed as shown in FIG. 21 such that actuation of the MEMS actuator will rotate the valve plates so as to at least partially uncover or open respective ones of the openings defined by the substrate. As shown in both FIGS. 20 and 21, the MEMS valve can include at least one stop 177 positioned upon the substrate for contacting a respective valve plate upon actuation of the MEMS valve so as to prevent excessive rotation of the valve plates.

As described above, the MEMS valve 170 of this embodiment can also include means for holding each of the valve plates 176 in position relative to the respective openings 172a even after the MEMS actuator has been deactuated, thereby further reducing the power requirements of the MEMS valve. Although not illustrated, the holding means preferably includes electrodes positioned upon the portion of the substrate 172 surrounding or at least adjacent to a respective opening. As such, the valve plate is preferably slightly larger than the respective opening such that the valve plate can completely cover the opening and a sufficient electrostatic force can be generated between the underlying electrode and the valve plate to restrict or stop fluid flow therethrough.

The various embodiments of the MEMS valve 170 of the present invention reliably control the fluid flow through one or more openings 172a defined in the substrate 172. By controllably covering and uncovering multiple openings, the overall fluid flow supported by the MEMS valve of the present invention is also increased relative to other designs that cover and uncover a single opening since the size of the opening which may be covered by a MEMS valve is generally limited by, among other things, the maximum displacement that the arched beams can apply. In addition, by employing a fan-type design, the amount of displacement provided by movement of the actuator member 190 is multiplied by the ratio of the length b of the valve plates 176 relative to the length a of the lever arm, i.e., the distance by which the connection of the end portion of the actuator member to the center plate 188 is offset from the pivot point. Since this ratio is typically greater than 1, the fan-type valve of the present invention permits the size of the openings that can be covered and uncovered by the valve plates to be increased.

MEMS structures, including the MEMS actuators, of the present invention provide significant forces and displacements while consuming reasonable amounts of power. As described above, the design of the MEMS actuator of the present invention provides efficient thermal transfer of the heat generated by the heater to the overlying metallic arched beam so as to create further arching of the metallic arched beam. In order to capitalize upon the efficient operation of the MEMS actuator of the present invention, a number of MEMS devices, such as a variety of MEMS relays, MEMS switching arrays and MEMS valves, are also advantageously provided.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A microelectromechanical structure comprising:
    a microelectronic substrate;
    a heater extending between first and second opposed ends, wherein the first and second ends are disposed on said microelectronic substrate;
    spaced apart supports on said microelectronic substrate; and
    a metallic arched beam extending between said spaced apart supports, wherein said metallic arched beam extends over and is spaced from said heater such that heat generated by said heater causes said metallic arched beam to further arch.

2. A microelectromechanical structure according to claim 1 wherein said heater comprises:
    a core comprising at least partially conductive material having high resistivity; and
    a coating comprising a dielectric material surrounding said at least partially conductive core, a wherein said dielectric coating cooperates with an air gap defined between said metallic arched beam and said heater to electrically isolate said metallic arched beam from said at least partially conductive core.

3. A microelectromechanical structure according to claim 2 wherein said at least partially conductive material is selected from the group consisting of polysilicon, titanium and tungsten, and wherein said dielectric material is selected from the group consisting of silicon nitride and silicon dioxide.

4. A microelectromechanical structure according to claim 2 wherein the air gap defined between said metallic arched beam and said heater is less than 5 microns.

5. A microelectromechanical structure according to claim 4 wherein the air gap defined between said metallic arched beam and said heater is between 1 micron and 2 microns, and wherein said dielectric coating covering the portion of said at least partially conductive material that faces said metallic arched beam has a thickness of about 0.5 micron.

6. A microelectromechanical structure according to claim 1 further comprising a plurality of arched beams formed of nickel, said plurality of arched beams extending between said spaced apart supports.

7. A microelectromechanical structure according to claim 1 further comprising a lengthwise extending actuator member coupled to said metallic arched beam and extending outwardly therefrom in a first direction, wherein said heater underlies and is aligned with said actuator member in the first direction.

* * * * *

UNITED STATES PATENT AND TRADEMARK OFFICE
CERTIFICATE OF CORRECTION

PATENT NO.   : 6,023,121
DATED        : February 8, 2000
INVENTOR(S)  : Dhuler et al.

Page 1 of 1

It is certified that error appears in the above-identified patent and that said Letters Patent is hereby corrected as shown below:

Title page,
Item [56], References Cited, U.S. PATENT DOCUMENTS, insert the following:
--     5,870,518     2/1999     Haake et al.
       5,909,078     6/1999     Wood et al. --.
OTHER PUBLICATIONS, page 1
Line 9, "238-297" should read -- 283-297 --;

OTHER PUBLICATIONS, page 2,
Column 1,
Line 4, "Jan. 1989" should read -- Jan. 1995 --

Column 2,
Line 18, "NovaSenosr" should read -- NovaSensor --.

Column 22,
Line 52, after "core," cancel "a".

Signed and Sealed this

Sixteenth Day of April, 2002

Attest:

JAMES E. ROGAN
*Attesting Officer*     *Director of the United States Patent and Trademark Office*